United States Patent
Sugiyama et al.

(10) Patent No.: US 7,639,061 B2
(45) Date of Patent: Dec. 29, 2009

(54) SEMICONDUCTOR DEVICE AND CAPACITANCE REGULATION CIRCUIT

(75) Inventors: Koichi Sugiyama, Saitama (JP); Tomoki Inoue, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 136 days.

(21) Appl. No.: 11/589,169

(22) Filed: Oct. 30, 2006

(65) Prior Publication Data
US 2007/0040184 A1 Feb. 22, 2007

Related U.S. Application Data

(62) Division of application No. 10/452,287, filed on Jun. 3, 2003, now Pat. No. 7,141,832.

(30) Foreign Application Priority Data
Jun. 3, 2002 (JP) .............................. 2002-161469

(51) Int. Cl.
*H03K 17/04* (2006.01)
(52) U.S. Cl. ...................... 327/374; 327/375
(58) Field of Classification Search .................. 345/76; 327/374–377
See application file for complete search history.

(56) References Cited

U.S. PATENT DOCUMENTS

| | | | |
|---|---|---|---|
| 4,132,996 A | 1/1979 | Baliga | |
| 4,612,560 A | 9/1986 | Dortu et al. | |
| 5,341,004 A | 8/1994 | Furuhata | |
| 5,623,152 A | 4/1997 | Majumdar et al. | |
| 5,631,494 A | 5/1997 | Sakurai et al. | |
| 5,659,185 A | 8/1997 | Iwamuro | |
| 5,751,024 A | 5/1998 | Takahashi | |
| 5,766,966 A | 6/1998 | Ng | |
| 5,818,281 A | 10/1998 | Ohura et al. | |
| 6,008,518 A | 12/1999 | Takahashi | |
| 6,021,036 A | 2/2000 | Biljenga et al. | |
| 6,153,896 A | 11/2000 | Omura et al. | |
| 6,188,109 B1 | 2/2001 | Takahashi | |
| 6,362,046 B1 | 3/2002 | Arai | |
| 6,366,321 B1 | 4/2002 | Yonemoto | |
| 2003/0173579 A1 | 9/2003 | Ishii et al. | |

(Continued)

FOREIGN PATENT DOCUMENTS

JP 2621498 6/1997

(Continued)

OTHER PUBLICATIONS

M. Dessouky, et al., "Input switch configuration suitable for rail-to-rail operation of switched opamp circuits", Electronics Letters, vol. 35, No. 1, XP-002311885, Jan. 7, 1999, pp. 8-10.*

(Continued)

*Primary Examiner*—Lincoln Donovan
*Assistant Examiner*—Daniel Rojas
(74) *Attorney, Agent, or Firm*—Oblon, Spivak, McClelland, Maier & Neustadt, L.L.P.

(57) ABSTRACT

According to an embodiment of the invention, there is provided a semiconductor device comprising: a semiconductor element having a first main electrode, a second main electrode and a control electrode, a current flowing between the first and second main electrodes being controlled by a control signal which is input between the control electrode and the second main electrode; and a capacitor formed by providing an insulating layer between the second main electrode and the control electrode of the semiconductor element.

9 Claims, 20 Drawing Sheets

U.S. PATENT DOCUMENTS

2006/0145746 A1*  7/2006  Metzler .................... 327/427

OTHER PUBLICATIONS

Y. C. Gerstenmaier, et al. ISPSD, pp. 105-108, "Switching Behaviour of High Voltage IGBTs and its Dependence on Gate-Drive", May 1997.

T. Schuetze, et al. PCIM, pp. 1/10-10/10, "The New 6.5kV IGBT Module: A Reliable Device for Medium Voltage Applications", Aug. 2001.

Y. Onozawa, et al. "Great Improvement in Turn-On Power Dissipation of IGBTs With an Extra Gate Charging Function"; Proceedings of the 17$^{th}$ International Symposium on Power Semiconductor Devices & IC's; May 23-26, 2005; pp. 207-210.

* cited by examiner

SEMICONDUCTOR DEVICE AND CAPACITANCE REGULATION CIRCUIT

CROSS-REFERENCE TO RELATED APPLICATIONS

This application is a Divisional application of, and claims the benefit of priority under 35 U.S.C. § 120 from, U.S. application Ser. No. 10/452,287, filed Jun. 3, 2003, and claims the benefit of priority under 35 U.S.C. §119 from the prior Japanese Patent Application No. 2002-161469, filed on Jun. 3, 2002. The entire contents of each of the above applications are incorporated herein by reference.

BACKGROUND OF THE INVENTION

The present invention relates to a semiconductor device and a capacitance regulation circuit, and more particularly, to a insulated gate semiconductor device such as MOSFET (Metal-Oxide-Semiconductor Field Effect Transistor), insulated gate bipolar transistor (IGBT), and injection enhanced gate transistor (IEGT), and to a capacitance regulation circuit which adjusts the capacitance of these semiconductor devices dynamically.

In order to use electric energy effectively, power converters, such as an inverter, are used widely. And as a semiconductor device for electric power control used for these power converters, the insulated gate semiconductor devices which have an excellent controllability are being used mainly. In particular, the loss of the IGBTs has become lower and the blocking voltage thereof has become higher, and their application field has spread even into the fields of higher blocking voltage and the larger current, for which the GTO thyristors were used conventionally.

Since the insulated gate semiconductor devices such as IGBT etc. have a wide safe operating area, they do not need protection circuits, such as a snubber circuit used with the GTO (Gate Turn Off) thyristors conventionally. Moreover, in recent years, further reduction of switching loss has been achieved by reducing the impedance (gate resistance) of a gate drive circuit, and by switching at higher speed.

However, these measures produce a high rate of voltage change (dV/dt) and a high rate of current change (dI/dt). Furthermore, high dI/dt produces a surge voltage and a even higher dV/dt by synergy with the parasitic inductance of a circuit.

As a result, the insulated gate semiconductor device may have a bad influence on peripheral equipment by emitting a noise out of the device, or malfunction may arise because device's own gate voltage is changed. Furthermore, an excessive surge voltage may also cause the destruction of insulated gate semiconductor chip and/or a free wheeling diode (FWD) chip connected in parallel to the insulated gate semiconductor chip.

Particularly, although when the insulated gate semiconductor chip is turned on the FWD which is connected to the turned on chip in series and forms the arm of a bridge circuit will carry out reverse recovery operation, when dV/dt of FWD becomes high there becomes a danger that the gate of the IGBT which is connected in parallel to the FWD and should be in the OFF state may be charged and malfunction (turning into ON state) may occur.

Hereafter, this malfunction will be explained accompanying IGBT as a example, referring to FIG. 29.

That is, the circuit shown in this figure has the arm which consists of a first switching device in which IGBT1 and FWD1 are connected in parallel in opposite directions, and a second switching device in which IGBT2 and FWD2 are connected in parallel in opposite directions. A load is connected to the node of connection of the first switching device and the second switching device. In addition, although only one arm is illustrated in FIG. 29, the bridge circuit including another arm which is not illustrated is formed in an actual circuit.

Now, if turn-on of IGBT2 is carried out from the state where FWD1 is free wheeling the load current, FWD1 performs reverse recovery operation and the voltage Vka1 between cathode-anode of FWD1 rises at the same time IGBT2 becomes in a ON state and the voltage Vce2 between the collector and the emitter of IGBT2 will fall. Then, although IGBT1 is in the OFF state where its gate is reverse biased, dVcg/dt which is almost equivalent to dVka1/dt is applied between the collector and the gate, and then a displacement current occurs in the parasitic capacitance Ccg between them.

This displacement current has an effect of charging the parasitic capacitance Cge between the gate and the emitter of IGBT1 in the direction corresponding to a forward bias of the voltage Vge1 between the gate and the emitter of IGBT1. And if Vge1 exceeds a threshold value Vth, IGBT1 will carry out malfunction (turn-on), and a short circuit will be formed. This malfunction tends to happen, when dVka1/dt is high, or when the Ccg/Cge ratio of IGBT is high. Meanwhile, although another parasitic capacitance also exists between the collector and the emitter of IGBT, it is not illustrated since it is unrelated to the operation mentioned above.

Although high-speed switching obtained by a reduction of gate resistance of the gate drive circuit exactly reduces the turn-on loss Eon of IGBT, since dI/dt and dV/dt become high in connection with it, it will make the reverse recovery loss Err of FWD occurred simultaneously increase. Particularly, when excessive dI/dt and dV/dt occur, a large electric power arises momentarily in FWD and the problem that FWD may breaks occurs. That is, since the problems that Err of FWD increases and that FWD breaks occurred, there was a limit in making the switching speed higher, and consequently, there was a limit in reducing the total loss of the power converter.

In order to solve these problems, as illustrated in FIG. 30, a trial to suppress the generation of a noise or change in the voltage Vge between the gate and the emitter was carried out by connecting a capacitor CGE between the gate terminal and the emitter terminal of the semiconductor device containing an insulated gate semiconductor chips (IGBT is shown in this figure as an example). However, since the switching time and Eon increase because of the capacitor CGE, techniques to make the capacitance between the gate and the emitter inside the semiconductor device small, and to connect the minimum capacitor CGE if needed at the time of operation has been taken.

However, it was difficult to stably suppress the change of Vge of the insulated gate semiconductor chip itself by such conventional techniques, because of the impedance inside the semiconductor device, the impedance up to the connection point of the capacitor CGE connected at the exterior of the semiconductor device, and the inductance of the CGE itself. Especially, in the large-sized package for the large current capacity which includes many insulated gate semiconductor chips, since the gate wiring in a package becomes long, the parasitic inductance cannot be disregarded. Therefore, gate resistances rg need to be provided in each chip in order to suppress the oscillation phenomenon due to the parasitic inductance.

As a result, it was difficult to stably suppress the changes in Vge for every chip with the conventional structure. Moreover, connecting the capacitor outside the device had the problem of not being mechanically reliable.

On the other hand, a semiconductor device to which capacitor CGE is added on the substrate on which the insulated gate semiconductor chip is mounted is disclosed in Japanese Patent Laid-Open Publication No. 2000-243905. That is, it becomes possible to suppress the change in Vge and to improve the mechanical reliability to some extent by incorporating capacitor CGE on the mounting substrate in the semiconductor device.

However, as a result of original examination by the inventors, it has become clear that there was room for the further improvement in the semiconductor device disclosed in Japanese Patent Laid-Open Publication No. 2000-243905. That is, since the generation of heat from the insulated gate semiconductor chip is relatively large, if capacitor CGE is mounted on the same mounting substrate as the insulated gate semiconductor chip, the influence of the rise of temperature cannot be disregarded.

Specifically, the maximum temperature of the substrate on which the insulated gate semiconductor chips, such as IGBT, are mounted may rise up to even about 125 degrees centigrade during operation. As a result, there is a possibility that the thermal fatigue of solder which mounts capacitor CGE may arise. Moreover, since there is "variation" in a temperature coefficient for each capacitor CGE, there is a possibility that the switching operation of two or more chips provided in the same equipment becomes less uniform.

Furthermore, if the insulated gate semiconductor chips which serve as a heat source are separated from the capacitors CGE in order to prevent these problems, it becomes necessary to enlarge the mounting substrate, and as a result, the size of the semiconductor device becomes enlarged.

As mentioned above, when gate resistance is reduced for the reduction of loss in the conventional insulated gate semiconductor device, high dI/dt, high dV/dt, and a high surge voltage may occur, IGBT/FWD may be broken, the noise may be emitted to the environment, and malfunction may be carried out by its own change of Vge.

Moreover, there was a limit in reduction of total loss including IGBT and FWD.

Furthermore, since the impedance from each chip was not able to be disregarded in a large-sized insulated gate semiconductor device by the method of connecting the external capacitor CGE to the exterior of the semiconductor device, it was difficult to stably suppress change in Vge of the semiconductor chips.

Furthermore, when the capacitors CGE are incorporated on the same mounting substrate as the insulated gate semiconductor chips, there is concern about the influence by heat.

SUMMARY OF THE INVENTION

According to an embodiment of the invention, there is provided a semiconductor device comprising: a semiconductor element having a first main electrode, a second main electrode and a control electrode, a current flowing between the first and second main electrodes being controlled by a control signal which is input between the control electrode and the second main electrode; and a capacitor formed by providing an insulating layer between the second main electrode and the control electrode of the semiconductor element.

According to other embodiment of the invention, there is provided a semiconductor device comprising: a mounting substrate; a semiconductor element mounted on the mounting substrate, the semiconductor element having a first main electrode, a second main electrode and a control electrode, a current flowing between the first and second main electrodes being controlled by a control signal which is input between the control electrode and the second main electrode; and a control substrate provided apart from the mounting substrate, the control substrate having a capacitor including a first conductive layer connected to the second main electrode, a second conductive layer connected to the control electrode, and an insulating layer provided between the first and the second conductive layers.

According to other embodiment of the invention, there is provided a semiconductor device comprising: a mounting substrate; a semiconductor element mounted on the mounting substrate, the semiconductor element having a first main electrode, a second main electrode and a control electrode, a current flowing between the first and second main electrodes being controlled by a control signal which is input between the control electrode and the second main electrode; a control substrate provided apart from the mounting substrate, the control substrate having a first conductive layer connected to the second main electrode, and a second conductive layer connected to the control electrode; and a capacitor mounted on the control substrate, the capacitor being connected between the second main electrode and the control electrode.

According to other embodiment of the invention, there is provided a capacitance regulation circuit that regulates a capacitance which is added to a semiconductor element having a first main electrode, a second main electrode and a control electrode, a current flowing between the first and second main electrodes being controlled by a control signal which is input between the control electrode and the second main electrode, comprising: a capacitor; and a switch, wherein the switch operates so that the capacitor is connected between the second main electrode and the control electrode during a part of a period when a voltage between the second main electrode and the control electrode changes in accordance with a switching operation of the semiconductor element.

According to other embodiment of the invention, there is provided a semiconductor device comprising: a semiconductor element having a first main electrode, a second main electrode and a control electrode, a current flowing between the first and second main electrodes being controlled by a control signal which is input between the control electrode and the second main electrode; and a capacitance regulation circuit that regulates a capacitance which is added to the semiconductor element, the capacitance regulation circuit including a capacitor and a switch, wherein the switch operates so that the capacitor is connected between the second main electrode and the control electrode during a part of a period when a voltage between the second main electrode and the control electrode changes in accordance with a switching operation of the semiconductor element.

According to the invention, dI/dt at the switching and the surge voltage resulting from it can be suppressed, and the insulated control semiconductor device having a low noise, low loss, and a wide safe operating area can be offered.

In particular, according to the first embodiment, since a capacitor is made to add at inside or near the semiconductor element, the reliability as a capacitor becomes high and thus, the insulated control semiconductor device which can prevent malfunction certainly even in the large-sized multi-chip type form can be offered.

Moreover, according to the second embodiment, it becomes possible to add a capacitor to a switching element with the optimal timing and the optimal period, and switching time is not increased unnecessarily. Rather, since the control resistance can be made smaller than before, switching time becomes shortened and loss can also be reduced. That is, the insulated control semiconductor device and a capacitance regulation circuit which can realize the low noise characteristics by suppression of dI/dt at switching and by suppression of the surge voltage resulting from it, shortening of the switching time and low loss can be offered.

As a result, total loss becomes lower than before, stable operation can be enabled and thus the merit on industry is great.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings:

FIG. 12A shows the side view, and FIG. 12B shows the plane view thereof;

DETAILED DESCRIPTION

Referring to drawings, some embodiments of the present invention will now be described in detail.

First Embodiment

First, a semiconductor device integrated with a capacitor Cge2 which adjusts the capacitance between the gate and the emitter of an insulated gate semiconductor chip will be explained as a first embodiment of the invention, referring to FIG. 1 through FIG. 17.

Figure 1:
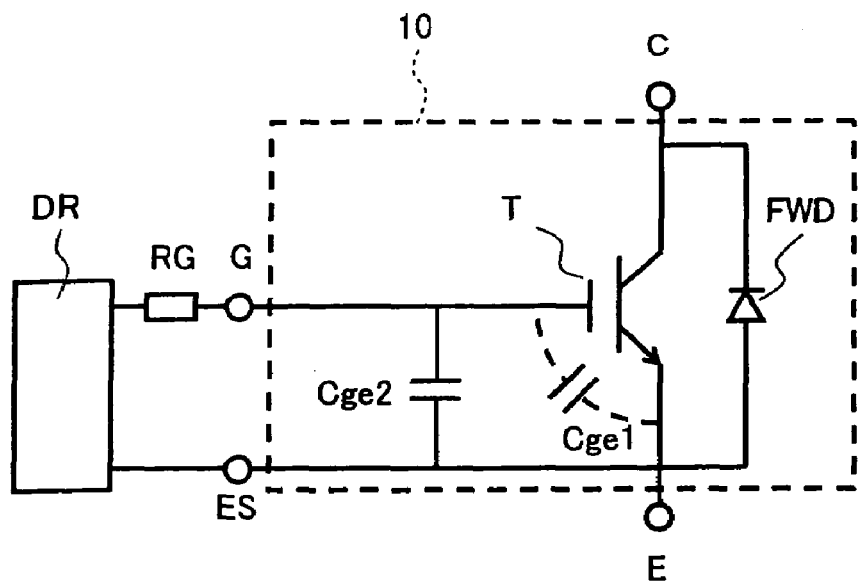
FIG. 1 is a schematic diagram illustrating the insulated gate semiconductor device and the drive circuit connected thereto according to the first embodiment of the invention.

FIG. 1 is a schematic diagram illustrating the insulated gate semiconductor device and the drive circuit connected thereto according to the first embodiment of the invention. That is, the semiconductor device 10 shown in this figure is an insulated gate semiconductor device including the switching chip T and a FWD chip. The switching chip T and FWD are connected in parallel and in opposite directions. As a switching chip T, IGBT or various kinds of insulated gate semiconductor chips can be used as will be explained detail after.

This semiconductor device 10 has the collector terminal C as a first main electrode, the emitter terminal E as a second main electrode, and gate terminal G as a control electrode. The collector terminal C and the emitter terminal E are connected to a main circuit which is not shown. On the other hand, gate terminal G and the second emitter terminal (sense terminal) ES are connected to a drive circuit DR. Furthermore, the gate resistance RG which determines switching speed is provided between the gate terminal G and the drive circuit DR.

Figure 29:
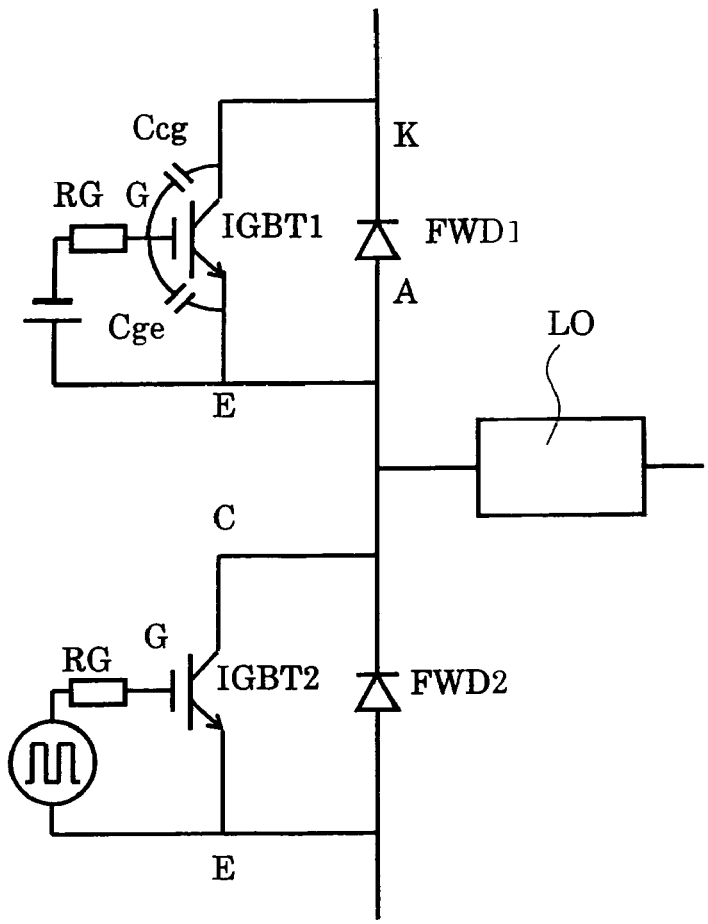
FIG. 29 is a schematic diagram to explain the malfunction in the conventional semiconductor device.
Figure 30:
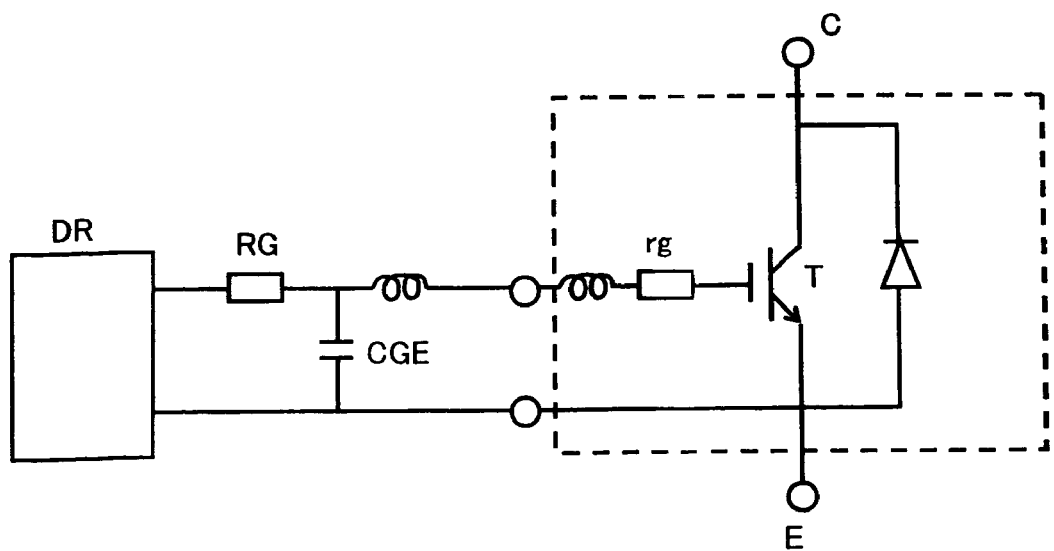
FIG. 30 is a schematic diagram showing a state where the capacitor CGE is connected between the gate terminal and the emitter terminal of the semiconductor device containing insulated gate semiconductor chips (IGBTs are shown in this figure as an example).

Although the parasitic capacitance exists between each electrode of the switching chip T, only the parasitic capacitance Cge1 between gate and emitter is shown in FIG. 1. And in the invention, apart from this parasitic capacitance, a capacitor Cge2 is provided between the gate and the emitter. Thus, the effect that the malfunction by change of gate voltage which was mentioned above referring to FIGS. 29 and 30 can be suppressed well is acquired by providing the capacitor Cge2 near the IGBT chip and by making Cge2>Cge1.

Moreover, even if the gate resistance RG is made low in order to make the switching chip T switch at high speed, the effect that excessive dI/dt and dV/dt which poses a problem when the capacitor Cge2 is not provided do not occur is acquired.

Figure 2:
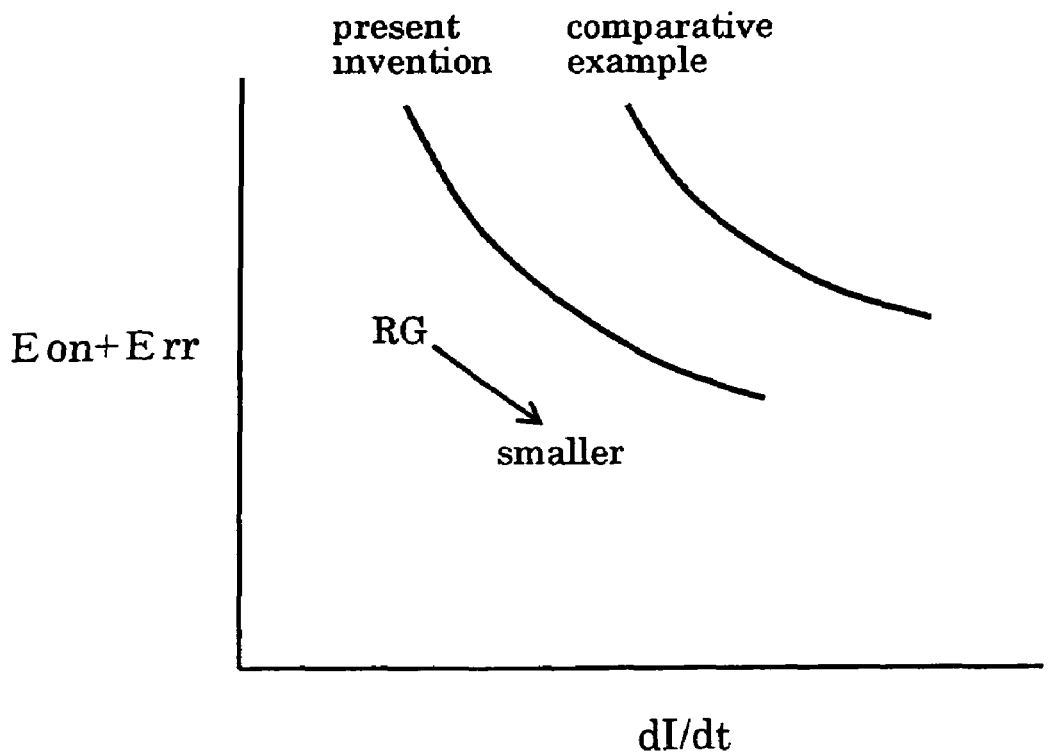
FIG. 2 is a graphical representation showing the relation between the rate of change of current and the loss in the semiconductor devices of the first embodiment and a comparative example.

FIG. 2 is a graphical representation showing the relation between the rate of change of current and the loss in the semiconductor devices of the embodiment and a comparative example. That is, the horizontal axis of the figure expresses rate-of-change of current dI/dt, and a vertical axis expresses the sum of the turn-on loss Eon of the switching element T (IGBT) and the reverse recovery loss Err of FWD. Moreover, the capacitor Cge2 which was shown in FIG. 1 is not provided in the semiconductor device of the comparative example.

Here, if the gate resistance RG is made small, the speed of switching becomes high, namely, the rate of change (dI/dt) of current becomes high.

FIG. 2 shows that a rate of change of current (dI/dt) becomes higher in the case of the semiconductor device of the comparative example in which the capacitor Cge2 is not provided. That is, the rate of change of current needed in order to acquire low loss becomes high in the semiconductor device of the comparative example. As a result, if the gate resistance RG is made small in order to reduce loss, dI/dt will become excessive and a limit will arise due to a generating of a surge voltage accompanying it etc. In contrast to this, according to the embodiment, rate-of-change of current dI/dt for acquiring low loss can be lowered by providing the capacitor Cge2 of large enough capacitance. That is, it becomes possible to make gate resistance RG small and to reduce total loss (Eon+Err) without increasing rate-of-change of current dI/dt excessively.

Figure 3:
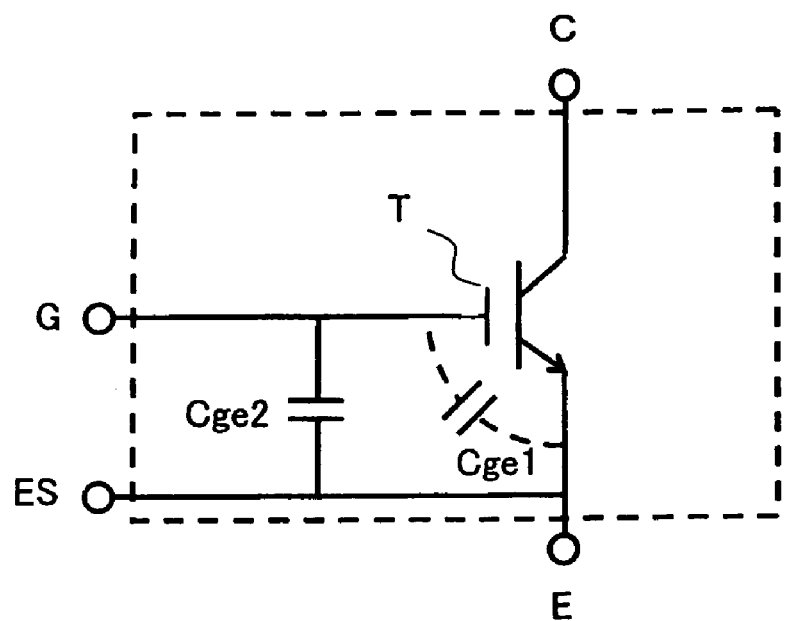
FIG. 3 is a schematic diagram illustrating the example of a first transformation of the first embodiment.

FIG. 3 is a schematic diagram illustrating the example of a first transformation of the embodiment. The same symbols are given to the same elements as what were mentioned above with reference to FIG. 1 and FIG. 2 about this figure, and detailed explanation will be omitted.

That is, the insulated gate semiconductor device of this example of transformation does not include the free wheeling diode FWD. It also becomes possible to make the gate resistance RG small and to reduce the turn-on loss Eon without increasing the rate-of-change of current dI/dt excessively by providing the capacitor Cge2 in the case of the semiconductor device having such a structure.

Figure 4:
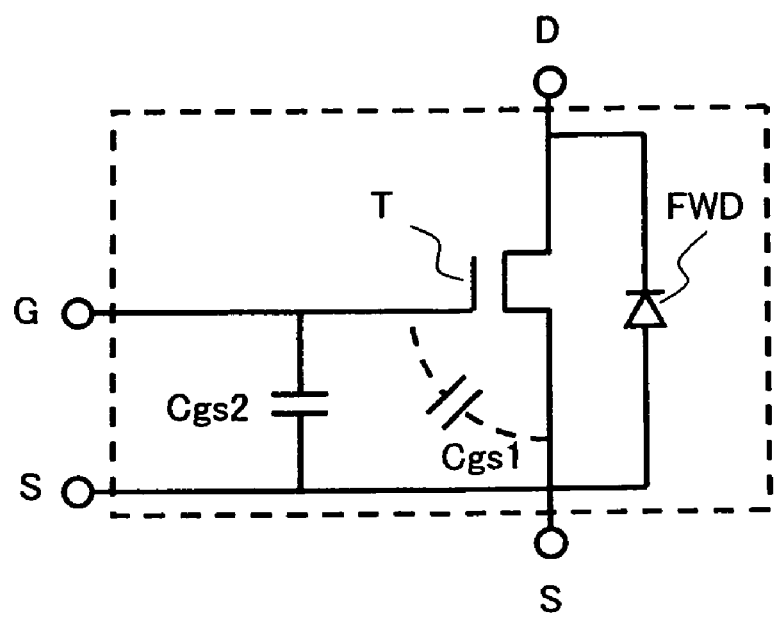
FIG. 4 is a schematic diagram illustrating the example of second transformation of the first embodiment.

FIG. 4 is a schematic diagram illustrating the example of second transformation of the embodiment. The same symbols are given to the same elements as what were mentioned above with reference to FIG. 1 through FIG. 3 about this figure, and detailed explanation will be omitted.

The insulated gate semiconductor device of this example of transformation has a MOSFET as a switching element T, and the source terminal S, the drain terminal D, and gate terminal G are provided. And also in this example of transformation, the capacitor Cgs2 is provided apart from the parasitic capacitor Cgs1 between the gate and the source of this MOSFET.

It also becomes possible to make gate resistance RG small and to reduce the total loss (Eon+Err) without increasing the rate-of-change of current dI/dt excessively by providing the capacitor Cge2 in the case of the semiconductor device having such a structure.

In the above, the examples of the fundamental structures of the semiconductor devices according to the embodiment were explained, referring to FIG. 1 through FIG. 4.

Next, the concrete structures of the capacitor Cge2 (or Cgs2) provided apart from the parasitic capacitor in the embodiment will be explained.

Figure 5:
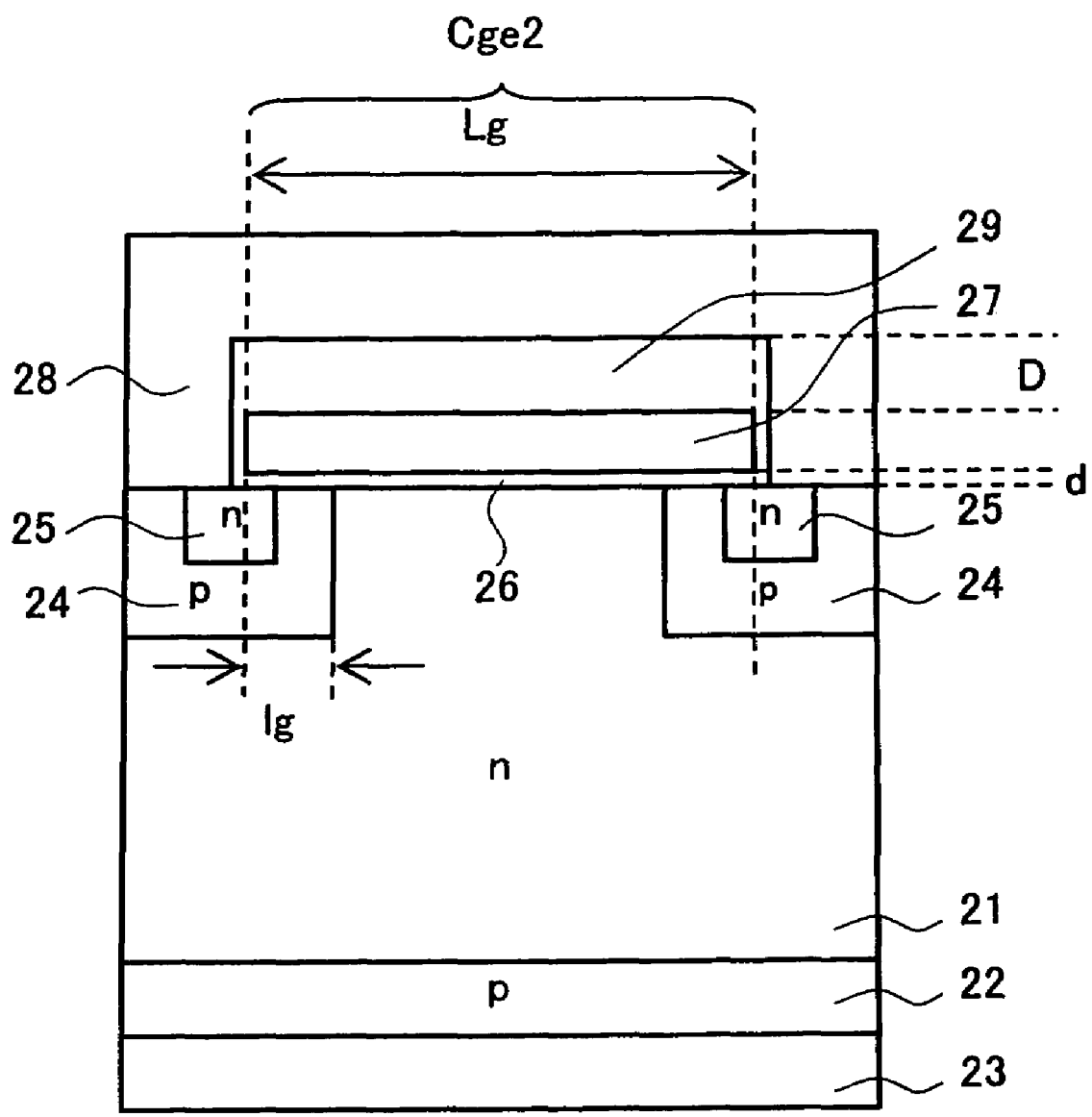
FIG. 5 is a schematic diagram illustrating an example of the capacitor Cge2 in the first embodiment.

FIG. 5 is a schematic diagram illustrating an example of the capacitor Cge2 in the embodiment. That is, this figure is a sectional view of the insulated gate semiconductor cell (IGBT) which can be used as the switching chip T.

First, the whole structure will be explained. The p type base regions 24 are selectively formed on the surface of the n type base layer 21, and n type source regions 25 are selectively formed in the inner side of the p type base regions 24. And the gate electrode 27 is formed on the surface of the n type base layer 21 and the p type base layers 24 via the gate insulating film 26. Moreover, the emitter electrode 28 is connected to the p type base region 24 and the n type source region 25.

On the other hand, the p type emitter layer 22 is formed on the opposite side of the n base, and the collector electrode 23 is formed on the p type emitter layer 22.

And in this example, the insulating layer 29 is provided on the gate electrode 27, and the emitter electrode 28 is made to extend so that it may cover the insulating layer 29. Thus, the MIM (Metal-Insulator-Metal) type capacitor Cge2 which consists of the gate electrode 27, an insulating film 29, and extended part of the emitter electrode 28 is formed. The emitter electrode 28 can be made from metal, such as aluminum. The principal parts of the semiconductor devices which are illustrated in FIG. 1 through FIG. 4 can be integrated in one element by providing such an MIM type capacitor Cge2.

Figure 6:
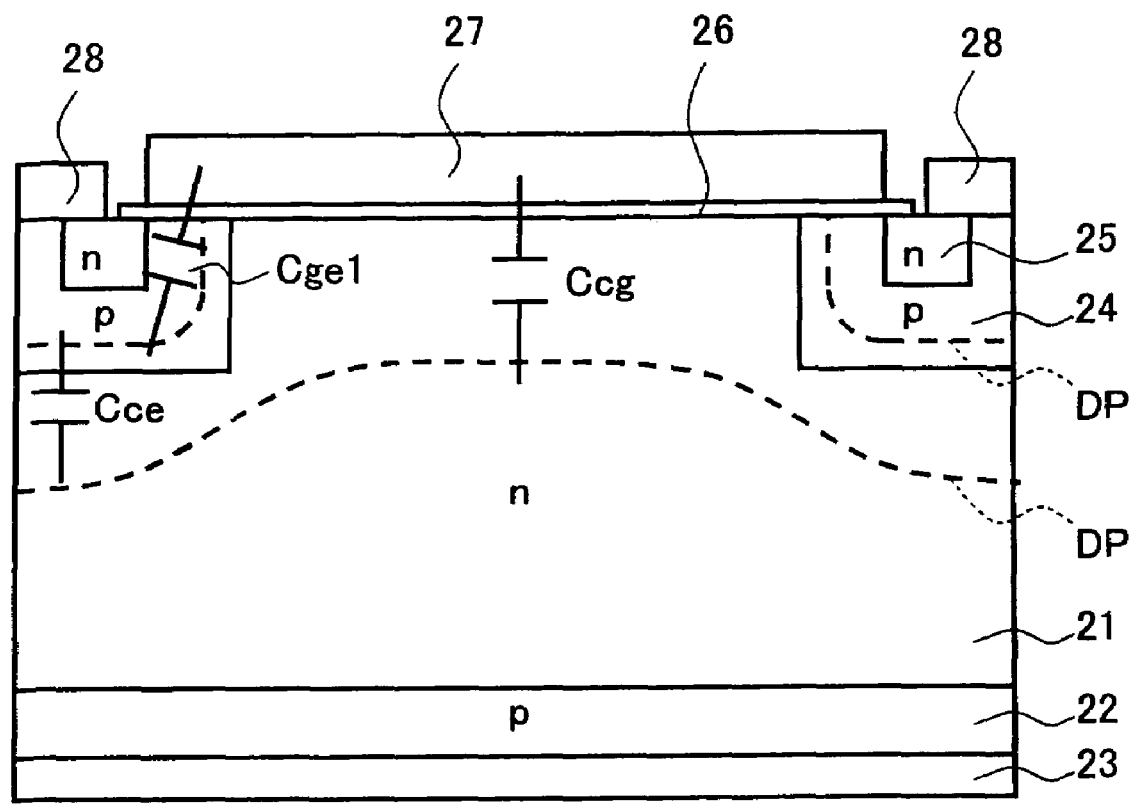
FIG. 6 is a schematic diagram in order to explain the parasitic capacitance in IGBT.

FIG. 6 is a schematic diagram in order to explain the parasitic capacitor in IGBT. That is, the parasitic capacitor Cge1 of IGBT is parasitic between the gate electrode 27 and the p type base layer 24, and between the gate electrode 27 and the n type source layer 25. Therefore, the capacitance is determined by the length lg (refer to FIG. 5) of the portion where they are facing, and by the dielectric constant and the thickness of the gate insulating film 26. Here, the width (depth) of the depletion layer DP which extends in the n type base layer 21 changes a lot depending on the voltage Vce between the collector and the emitter electrodes. For this reason, the parasitic capacitance Ccg between the collector and the gate, and the parasitic capacitance Cce between the collector and the emitter depend on Vce a lot.

On the other hand, there is the feature that the influence of the depletion layer DP to the parasitic capacitor Cge1 is small, and change of capacitance is small. And in the example expressed in FIG. 5, the MIM type capacitor Cge2 can be provided in parallel to such a stable parasitic capacitor Cge1.

In FIG. 5, d means the thickness of the gate insulating film 26, D means the thickness of the insulating film 29 between the gate electrode 27 and the emitter electrode 28, lg means the length of the portion where the gate electrode 27, p type base region 24 and n type source region 25 counter, Lg means the length of the portion where the gate electrode 27 and the emitter electrode 28 counter. Then, it is desirable to make these values to satisfy the following condition:

$$(E \times Lg/D) > (2 \times \in \times lg/d) \quad (1)$$

Here, E is the dielectric constant of the insulating film 29 and ∈ is the dielectric constant of the gate insulating film (made of a silicone oxide film, silicone nitride film, etc.) 26. That is, in the range with which an above condition is satisfied, the capacitance of the MIM type capacitor Cge2 can be made larger than the parasitic capacitor Cge1. Consequently, without increasing the rate-of-change of current dI/dt excessively, the gate resistance RG can be small and it becomes possible to reduce the total loss (Eon+Err). In addition, about acquiring an above-mentioned effect, there is no maximum of Cge2. If Cge2 is made larger than (2×Cge1), for example, then a bigger effect can be acquired.

In the case of the insulated gate semiconductor device which has the planar gate structure in which the gate electrode formed along the surface of a semiconductor such as silicon, it is desirable to satisfy the following condition:

$$(Cge1+Cge2)/I>0.3 \ (nF/A) \quad (2)$$

Here, I is the rated current of the semiconductor device. This reason will be explained hereafter. Now, when the gate insulating film is a silicon oxide ($SiO_2$) film which is 80 nm of thickness, and when the area ratio of the channel formation part (lg portion) is 0.1, the capacitance Cge1 between the gate and the emitter becomes about 4.4 $nF/cm^2$. Generally, the area ratio of the lg portion depends on the blocking voltage of the device. In the case of a device having a lower blocking voltage, the area ratio is made larger in order to reduce the channel resistance. On the other hand, in the case of an element having a higher blocking voltage, the area ratio is made smaller in order to increase the conductivity modulation. Therefore, for example, the element whose blocking voltage is 600V differs a lot in the capacitance Cge1 per unit area from the element whose blocking voltage is 4500V.

Therefore, a capacitance Cge1 can be expressed with the form where the dependency to the blocking voltage is small, by dividing by the rated current density which has a positive correlation with the area ratio of the lg section. Like above-mentioned example, the element whose area ratio of the lg section is about 0.1 has a high blocking voltage, and such a high blocking voltage device is used at current densities Jc of about 30-50 $A/cm^2$. Therefore, Cge1/Jc is smaller than 0.15 nF/A and in order to acquire sufficient effect, it is desirable to satisfy the condition shown by the above formula (2). Therefore, the condition intended by the formula (1) can be represented by the condition (2).

Figure 7:
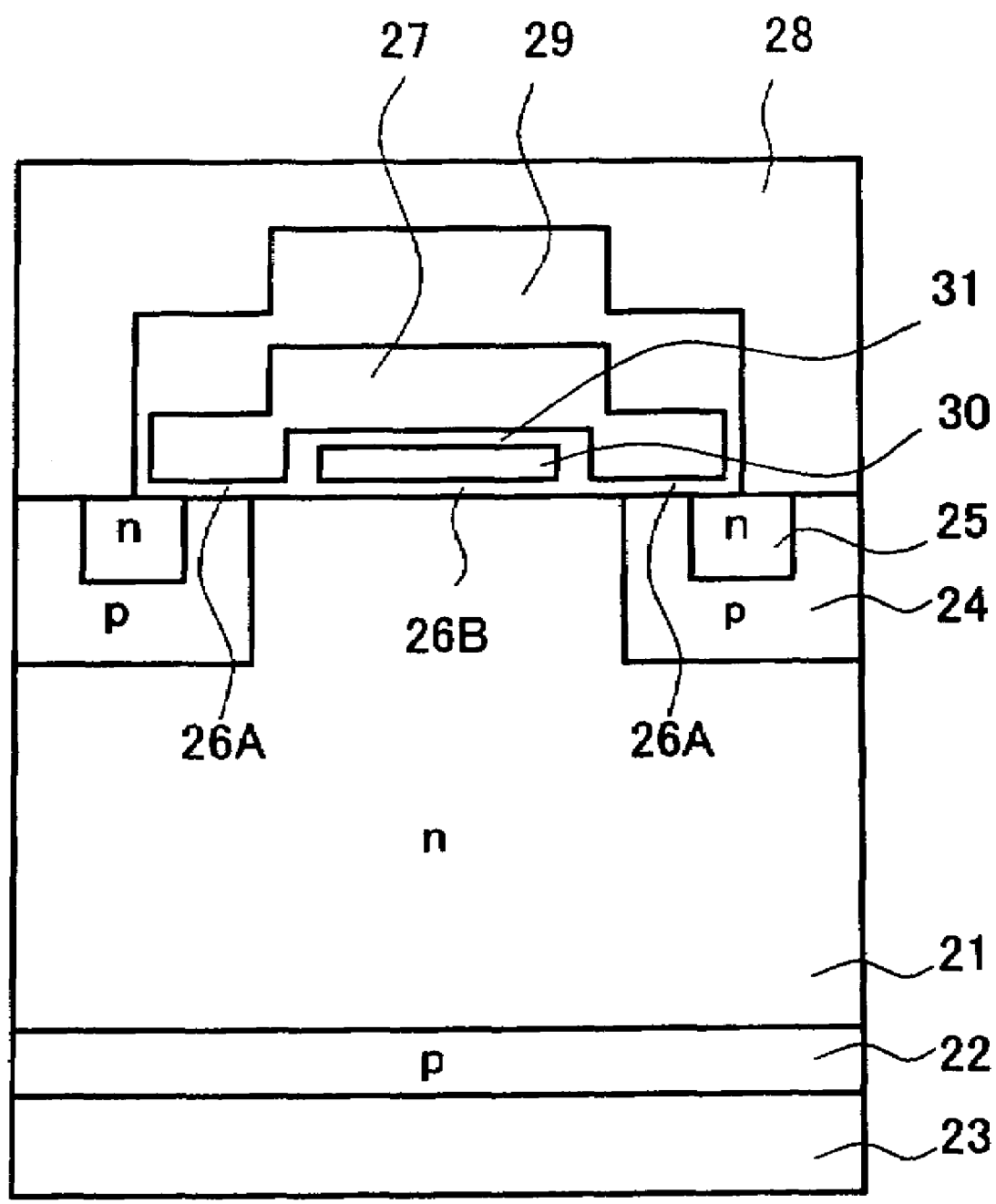
FIG. 7 is a sectional view showing another example of the insulated gate semiconductor cell where the capacitor Cge2 is integrated.

FIG. 7 is a sectional view showing another example of the insulated gate semiconductor cell where the capacitor Cge2 is integrated. The same symbols are given to the same elements as what were mentioned above with reference to FIG. 1 through FIG. 6 about this figure, and detailed explanation will be omitted.

In the case of this example, the gate electrode 27 is formed in the shape of a step. That is, the gate electrode 27 is provided so that it may be closer to the semiconductor layer on the p type base region 24, and it may be remoter from the semiconductor layer on the n type base layer 21. A gate insulating film 26A is provided between the p type base region 24 and the gate electrode 27. Between the n type base layer 21 and the gate electrode 27, the emitter electrode layer 30 is inserted so that the insulating film 26B and the insulating film 31 insulate the circumference of the emitter electrode layer 30.

And the emitter electrode 28 is provided over the insulating film 29 on the gate electrode 27. The emitter electrode layer 30 is connected with the emitter electrode 28 by the terminal area which is not illustrated. That is, the emitter electrode layer 30 is provided by making a part of the emitter electrodes 28 extend under the gate electrode 27.

According to this example, the effect that the capacitance of the capacitor Cge2 can be increased further, and the effect that the parasitic capacitance Cgc between the gate and the collector can be reduced are acquired by providing the emitter electrode layer 30 also in the gate electrode 27 bottom, and forming an MIM type capacitor. The insulating film 31 provided between the gate electrode 27 and the emitter electrode layer 30 can be formed as thin as the gate insulating film 26A etc. Thus, by forming the insulating film 31 thin, the capacitance of the capacitor Cge2 can be increased and it becomes easier to satisfy the condition, Cge2>Cge1.

Meanwhile, the gate insulating film 26A and the insulating film 26B under the emitter electrode layer 30 may be formed as a single same insulating film, or as different insulating films. For example, the gate insulating film 26A may be formed on the semiconductor layer first, and a part of the film 26A may be used as the insulating film 26B as it is. Or, another insulating film may be laminated on it to form the insulating film 26B.

Alternatively, the insulating film 26B is provided on the semiconductor layer first, and a part of the insulating film 26B on a channel region may be removed selectively, and then gate insulating film 26A may be formed separately. In this case, if the gate insulating film 26A is formed after forming the insulating film 26B and also after forming the emitter electrode layer 30 further, it is also possible to constitute a part of the insulating film 31 by the gate insulating film 26A.

Figure 8:
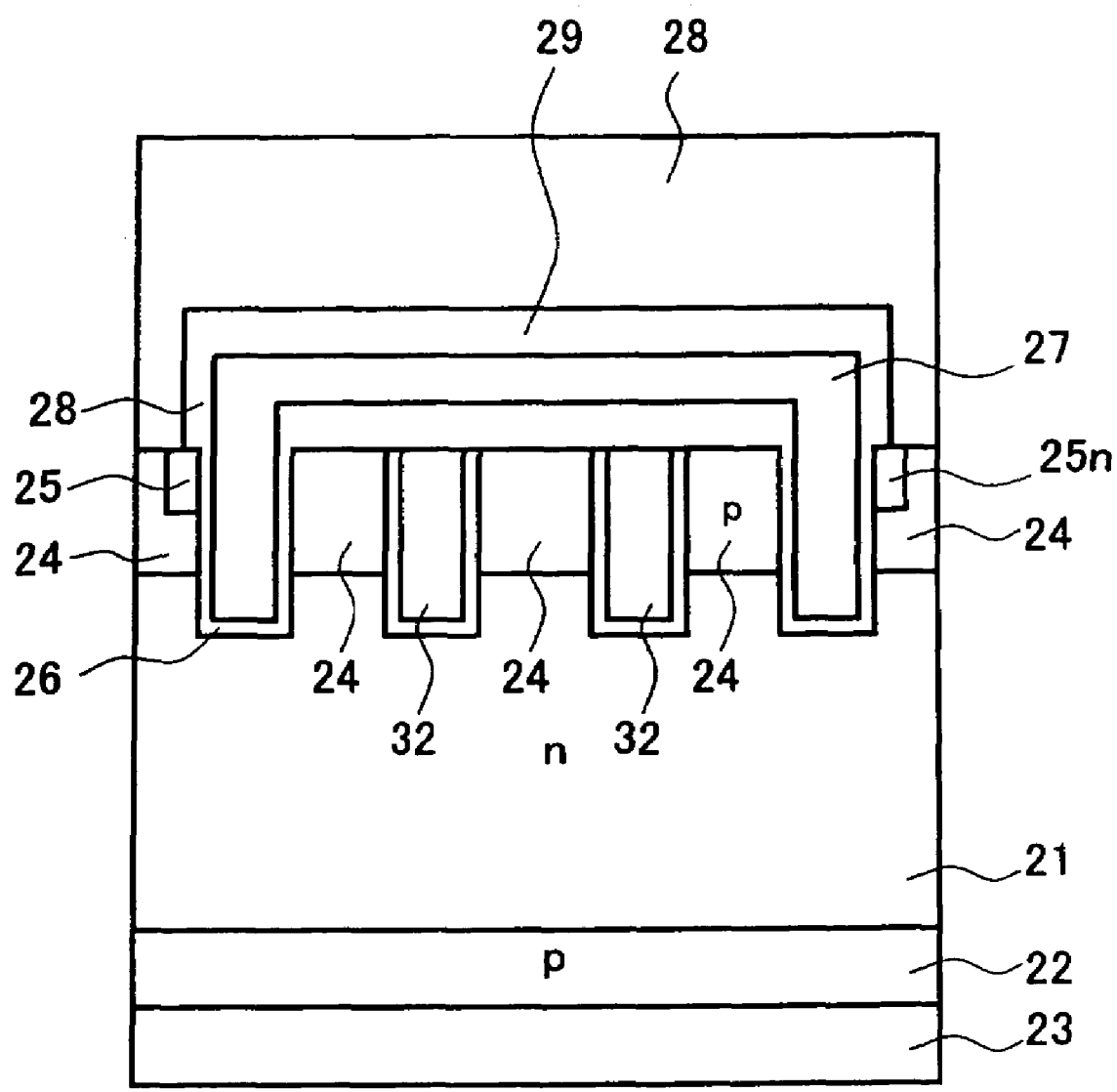
FIG. 8 is a sectional view showing another example of the insulated gate semiconductor cell where the capacitor Cge2 is integrated.

FIG. 8 is a sectional view showing another example of the insulated gate semiconductor cell where the capacitor Cge2 is integrated. That is, this example is IGBT having the so-called "trench gate structure." The same symbols are given to the same elements as what were mentioned above with reference to FIG. 1 through FIG. 7 about this figure, and detailed explanation will be omitted.

In the device with high blocking voltages, the conductivity modulation is promoted by reducing the number of the contacts of the emitter electrode in many cases. In that case, with regard to the second trench T2 which is not used as a gate electrode, the internal electrode 32 thereof is connected to the emitter electrode 28 in the section which is not illustrated. The internal electrode 32 is connected to the emitter electrode instead of a gate electrode in order not to enlarge Ccg unnecessarily.

On the other hand, Cge2 can be made by making the gate electrode 27 extend into the insulating film 29 which is located between the semiconductor layer and the emitter electrode 28. That is, capacitors are formed, respectively between the extended part of the gate electrode 27 and the emitter electrode 28, and between the extended part of the gate electrode 27 and the p base layer 24.

Moreover, in the case of the insulated gate semiconductor device which has such trench gate structure, it is desirable to satisfy the condition represented by the following formula:

$$(Cge1+Cge2)/I>0.9 \ (nF/A) \quad (3)$$

Here, I means the rated current off the device. In the condition (3), capacitance Cge is larger than the case of the insulated gate semiconductor device which has the planar gate structure shown by the formula (2) mentioned above. The reason is because the gate channel density becomes at least three times larger in the case of the trench type cell, and thus, dI/dt at the turn-on becomes high if the capacitance Cge is kept at the same level.

Figure 9A:
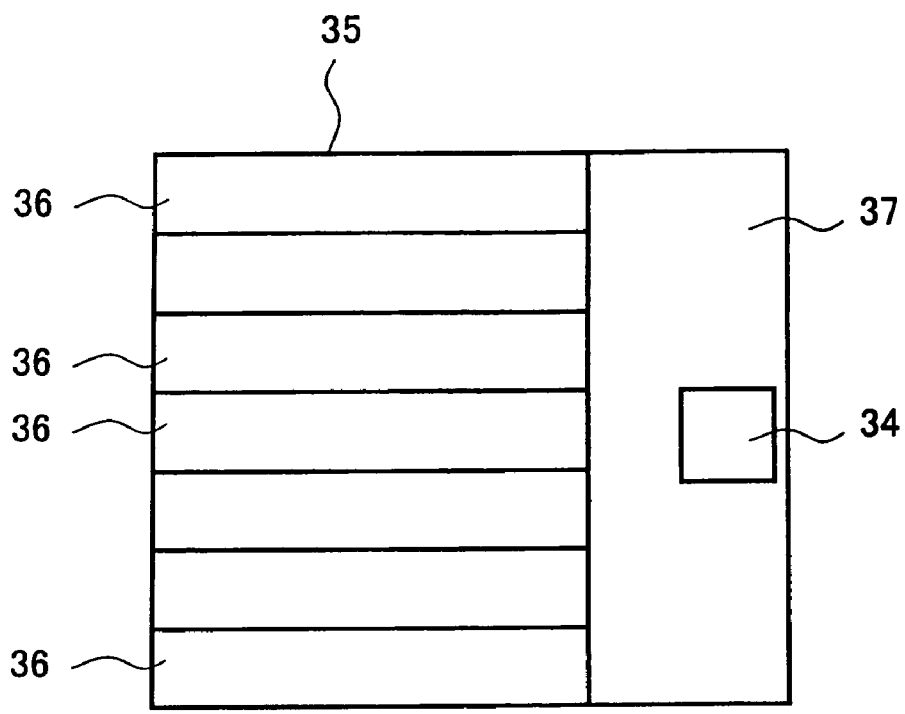
FIGS. 9A and 9B are plane views showing other example of the insulated gate semiconductor chip where the capacitor Cge2 is integrated.
Figure 9B:
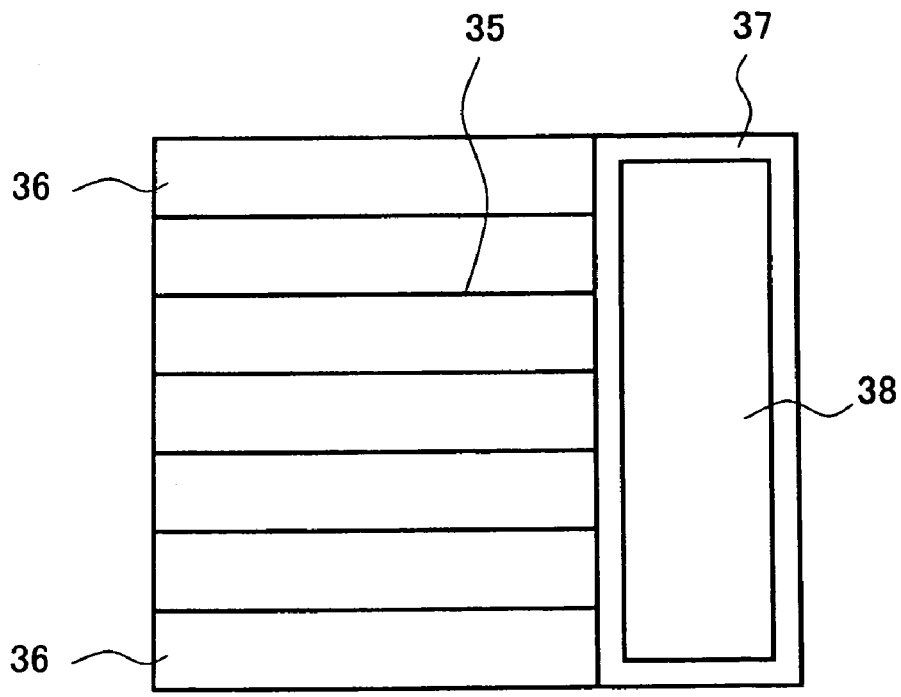
Figure 10:
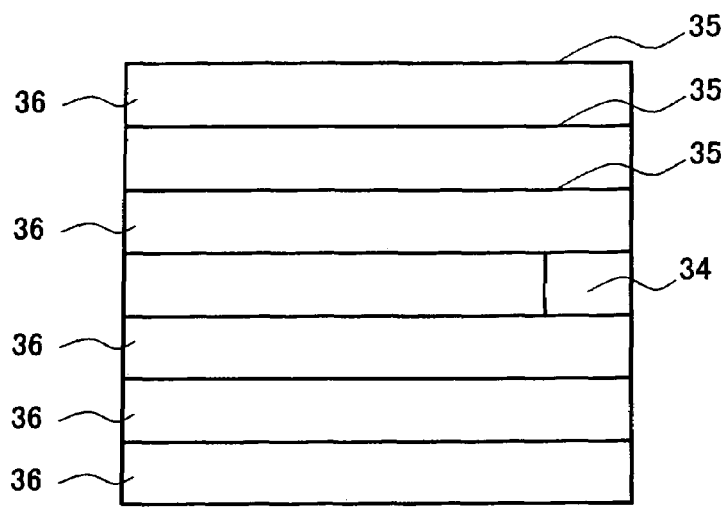
FIG. 10 is a plane view showing the insulated gate semiconductor chip as a comparative example.

FIGS. 9A and 9B are plane views showing other example of the insulated gate semiconductor chip where the capacitor Cge2 is integrated. Moreover, FIG. 10 is a plane view showing the insulated gate semiconductor chip as a comparative example.

First, plane arrangement of the chip of FIG. 10 will be explained. The junction termination area which is not illustrated for securing the blocking voltage is provided in the circumference of the chip, and plane structure which is illustrated in FIG. 10 is provided at the inside of the circumference. That is, the gate electrode pad 34, the gate wiring region 35, and the emitter electrode region 36 are arranged as shown in FIG. 10.

On the other hand, in the invention, an insulating film 37 is first provided on the emitter electrode region 36 in the surrounding of the gate pad 34, as shown in FIG. 9A. This insulating film 37 may be formed by, for example, a silicon oxide ($SiO_2$), a silicon nitride ($Si_3N_4$), ceramics such as ferroelectric materials and high dielectric constant materials, and various kinds of imide materials such as polyimide, and has the opening H made consistent on the gate pad 34.

And as shown in FIG. 9B, the gate electrode layer 38 is formed on it. The gate electrode layer 38 is connected with the gate pad 34 through the opening H. Then the MIM type capacitor is formed by the emitter electrode region 36 and the gate electrode layer 38 sandwiching the insulating film 37.

Required Cge2 can be obtained by adjusting the facing area of the capacitor, the permittivity and the thickness of the insulating film 37.

Next, the example in which the capacitor Cge2 is integrated in the so-called "multi chip module" will be explained.

Figure 11:
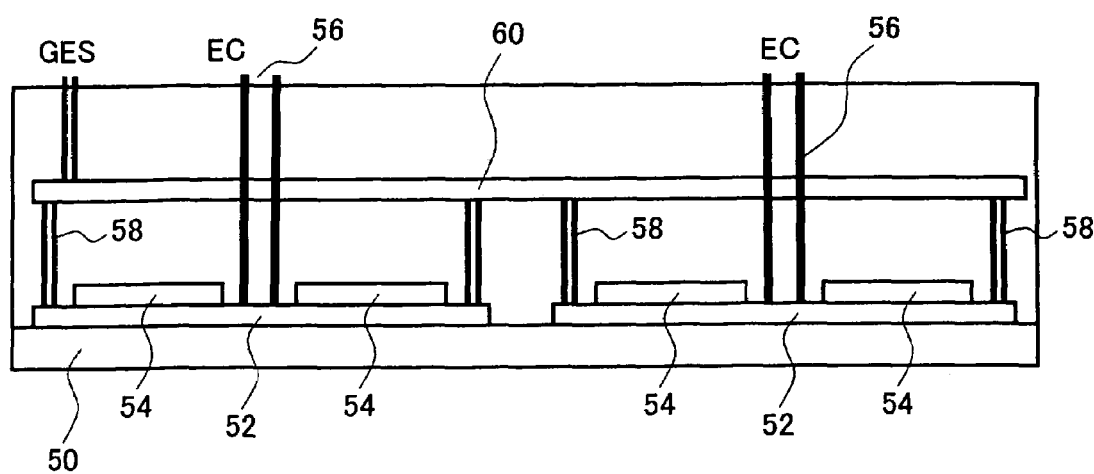
FIG. 11 is a schematic diagram showing the cross-sectional structure of the multi chip module of the example of the invention.

FIG. 11 is a schematic diagram showing the cross-sectional structure of the multi chip module of this example.

That is, the semiconductor chip 54 is mounted on the metal circuit pattern which is not illustrated on the insulating substrate 52 by soldering or wire bonding. The insulating substrate 52 is bonded to the base board 50 excellent in heat dissipation and mounted on a heat sink which is not illustrated. The main electrode terminal 56 is connected to the main electrode (collector C and emitter E) pattern formed on the insulating substrate 52, and these main electrodes are taken out to the exterior of the module.

On the other hand, the connection electrode 58 is connected to the control electrode (gate G and emitter ES) pattern formed on the insulating substrate 52, and the electrode 58 is connected to the gate substrate 60.

Figure 12A:
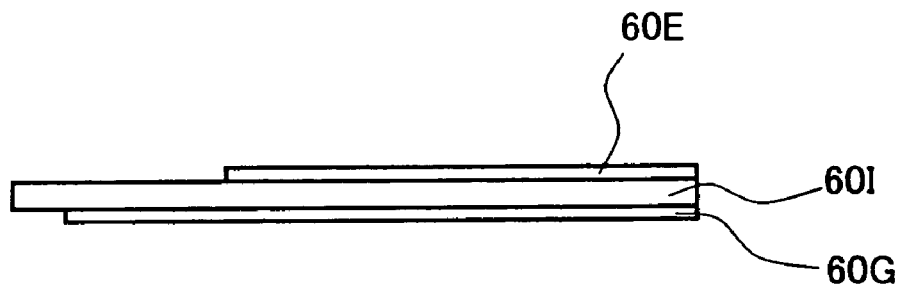
FIGS. 12A and 12B are schematic diagrams which illustrates the structure of the gate substrate 60, where
Figure 12B:
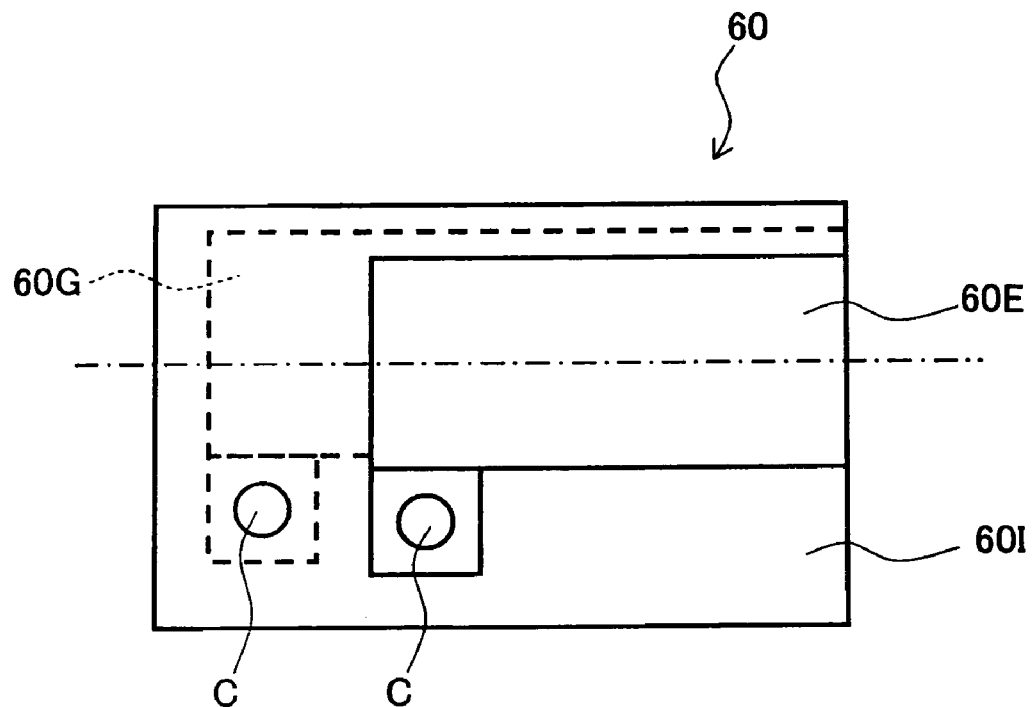

FIGS. 12A and 12B are schematic diagrams which illustrates the structure of the gate substrate 60. That is, FIG. 12A shows the side view, and FIG. 12B shows the plane view thereof.

This gate substrate 60 has the structure where the gate wiring layer 60G and the emitter wiring layer 60E are countered through the insulating layer 60I. The insulating layer 60I can be formed by resin, ceramics, etc. And the gate wiring layer 60G and the emitter wiring layer 60E are appropriately connected at the terminal areas C to the semiconductor element or external connection terminal which is not illustrated, respectively.

By providing the gate substrate 60 with such counter electrodes, it becomes possible to obtain the capacitor Cge2 with a large capacitance. Here, a predetermined capacitance can be obtained by adjusting the thickness and the permittivity of insulating layer 60I, and the facing area of the gate wiring layer 60G and the emitter wiring layer 60E.

Figure 13A:
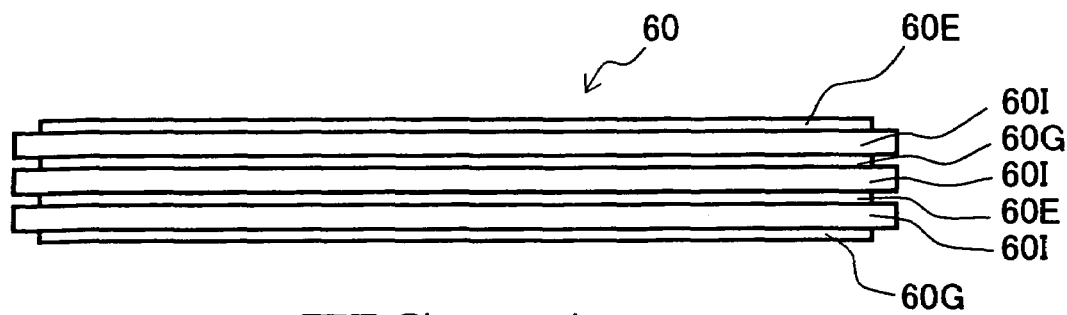
FIG. 13A is a schematic diagram which illustrates the cross-sectional structure of the example of transformation of the gate substrate 60.
Figure 13B:
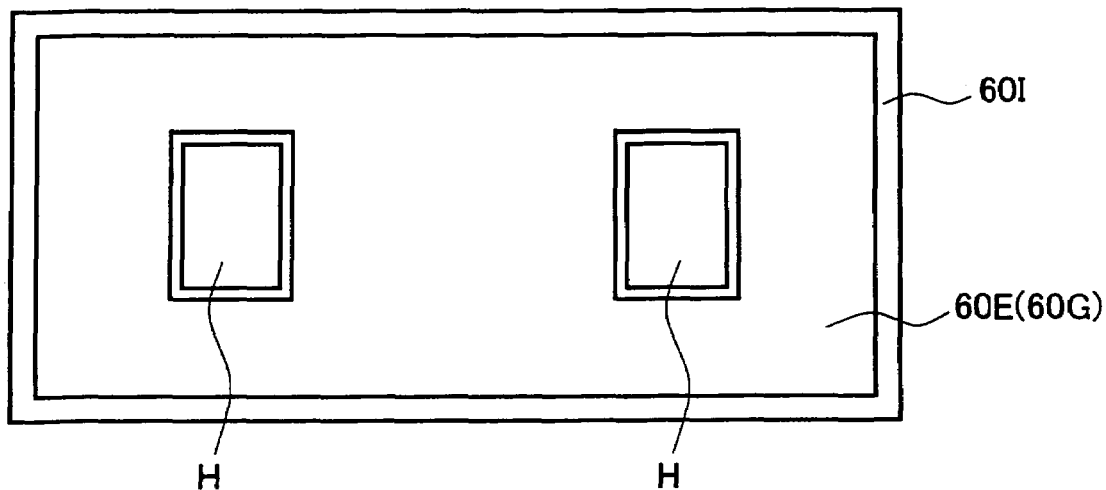
FIG. 13B is a schematic diagram which illustrates the plane structure thereof.

FIG. 13A is a schematic diagram which illustrates the cross-sectional structure of the example of transformation of the gate substrate 60, and the FIG. 13B is a schematic diagram which illustrates the plane structure thereof.

The gate substrate 60 of this example of transformation has the structure where the gate wiring layers 60G and the emitter wiring layers 60E are laminated by turns through the insulating layers 60I. That is, in the case of the example shown in FIGS. 13A and 13B, the two gate wiring layers 60G and the two emitter wiring layers 60E are laminated by turns through the insulating layers 60I. By making such a laminated structure, it becomes possible to make the capacitor Cge2 large enough.

Although the gate wiring layers 60G and the emitter wiring layers 60E are laminated all over the gate substrate in FIGS. 13A and 13B, they may be provided in one part of the gate substrate, or may be divided and provided for every semiconductor element chip.

In addition, the main electrode terminal 56 extended from the insulating substrate 52 is wired in the upper part of the module through the opening H shown in FIG. 13B.

Next, the example in which the capacitor Cge2 is integrated in the so-called "multi-chip pressure contact package" will be explained.

Figure 14:
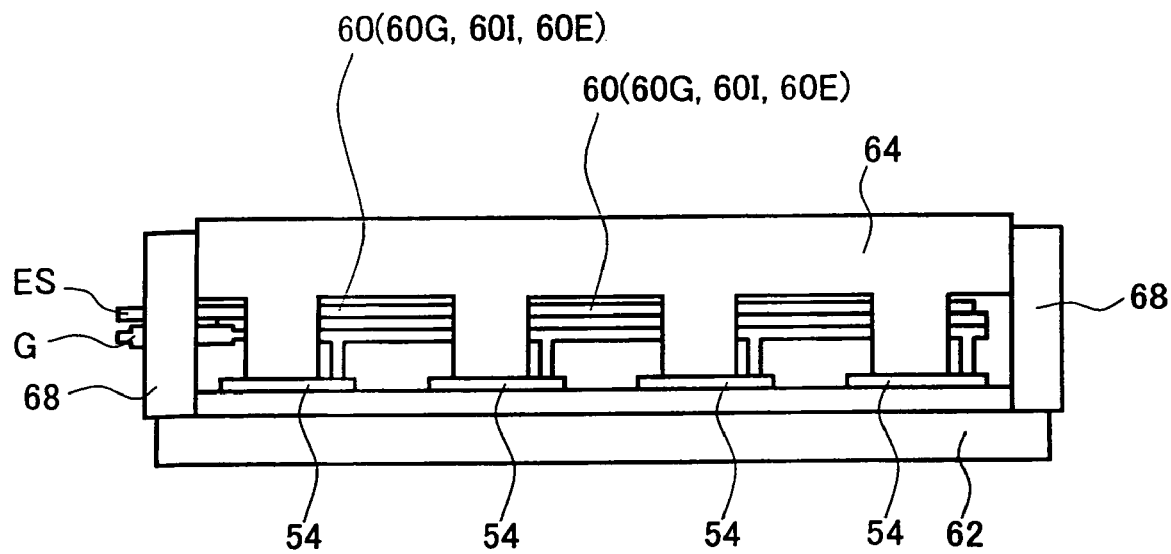
FIG. 14 is a schematic diagram showing the cross-sectional structure of the multi-chip press-packed package of the example of the invention.

FIG. 14 is a schematic diagram showing the cross-sectional structure of the multi-chip pressure contact package of this example.

The pressure contact of the semiconductor chips 54 is carried out from the upper and lower sides by two main electrode boards 62 and 64. The lower main electrode board 62 acts as a collector lead electrode. The upper main electrode board 64 acts as an emitter lead electrode. And apart from these, the gate (G) and the emitter (ES) are pulled out from the semiconductor chips 54, and they are connected to the gate substrate 60. The gate substrate 60 has the laminated structure of the gate wiring layers 60G, the insulating layers 60I, and the emitter (sense) wiring layers 60E which are illustrated in FIGS. 13A and 13B and constitute the capacitors Cge2. The emitter (ES) does not necessarily need to be pulled out from the semiconductor chips 54, and emitter (sense) wiring layers 60E may be connected to an emitter lead electrode. (This is also the same with regard to the example shown in FIG. 11.) They are accommodated in the enclosure 68 of a package. By making gate wiring layer 60G of the gate substrate 60 approach to the main electrode plate 64 used as an emitter lead electrode, a capacitor Cge2 can be formed also at this portion, and it becomes possible to reduce the number of laminations of the gate substrate 60.

Next, the example in which capacitor elements, such as a ceramic capacitor or a chip capacitor are used, will be explained.

Figure 15:
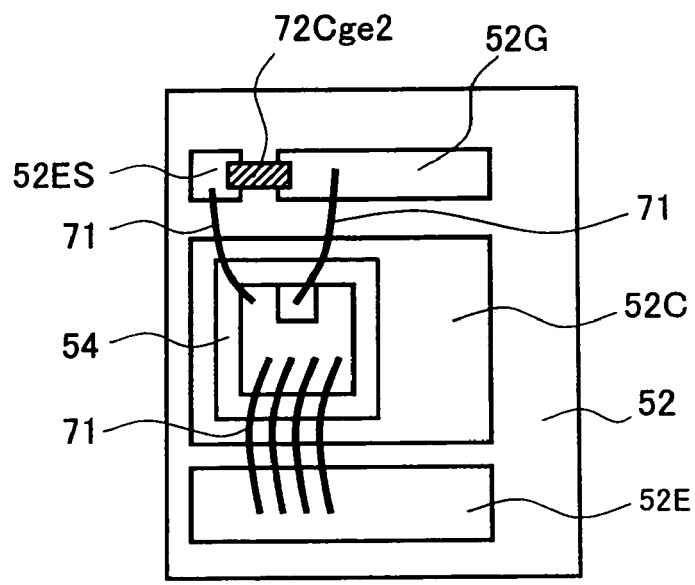
FIG. 15 is a schematic diagram showing the principal part of the module made as an experiment in process in which the inventors results in the invention.

FIG. 15 is a schematic diagram showing the principal part of the module made as an experiment in process in which the inventors results in the invention. That is, this figure expresses the plane structure of the insulating substrate 52 inside the multi chip module illustrated in FIG. 11. A semiconductor chip 54 is mounted on the collector electrode pattern 52C on the insulating substrate 52. The emitter electrode pattern 52E, the electrode pattern 52G for gates, and the emitter (sense) electrode pattern 52ES for emitter (sense) are provided at the circumference. The wires 71 are connected to each pattern from the semiconductor chip 54. And the capacitor 72 is connected between electrode pattern 52G for gates and electrode pattern 52ES for emitters on this insulating substrate 52.

This capacitor 72 acts as the capacitor Cge2.

However, in this way, when a semiconductor chip 54 and the capacitor 72 are mounted on the same substrate 52, there is a possibility that the solder of the capacitor 72 may experience a thermal fatigue with the heat from the semiconductor chip 54, or "deviation" etc. of the timing of switching operation by the variation in the temperature characteristics of a capacitance may arise.

On the other hand, the inventors have come to invent the structure where the capacitor is mounted on another substrate different from the substrate on which the semiconductor chip 54 is mounted.

Figure 16A:
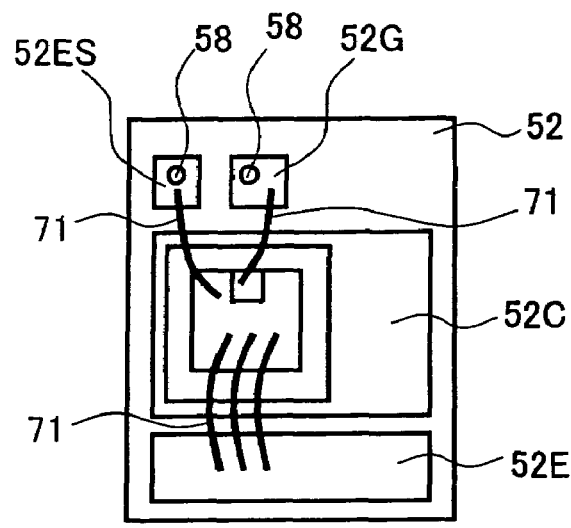
FIGS. 16A through 16C are schematic diagrams for explaining the internal structure of the module of the embodiment.
Figure 16B:
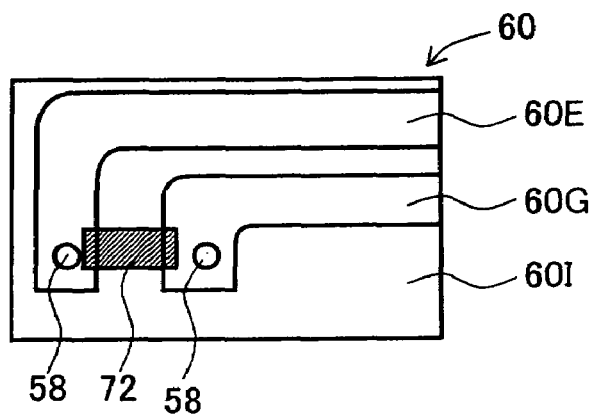
Figure 16C:
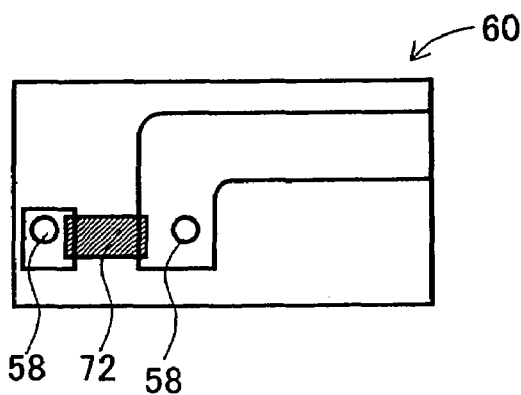

FIGS. 16A through 16C are schematic diagrams for explaining the internal structure of the module of the embodiment. That is, these figures also show the internal structure of the multi chip module shown in FIG. 11, for example. FIG. 16A shows the plane structure of the mounting substrate 52 provided inside of the module of the embodiment. The same symbols are given to the same elements as what were mentioned above with reference to FIG. 15 about this figure, and detailed explanation will be omitted.

The mounting substrate 52 is connected to the gate substrate 60 by the connection wiring 58 as shown in FIG. 11. FIG. 16B and FIG. 16C are the plane views showing a part of gate substrate 60. That is, on these gate substrates, the gate wiring 60G and the emitter wiring 60E are formed on the surface of insulating substrate 60I, and the capacitor 72 is connected among these. In addition, although the gate wiring 60G and the emitter wiring 60E are formed on the same plane in FIG. 16A, these also can be laminated through insulating layers.

Thus, the capacitor Cge2 which has a given capacitance is easily incorporable, avoiding the influence of heat by mounting the capacitor 72 on the gate substrate 60 instead of the substrate 52 on which the semiconductor chip 54 is mounted.

In the above, the insulated gate semiconductor device of the embodiment has been explained, referring to FIG. 1 through FIG. 16C. However, the present invention is not limited to these specific examples. For example, the present invention can be applied to the semiconductor device including two or more insulated gate semiconductor elements, and can attain the similar effects.

Figure 17:
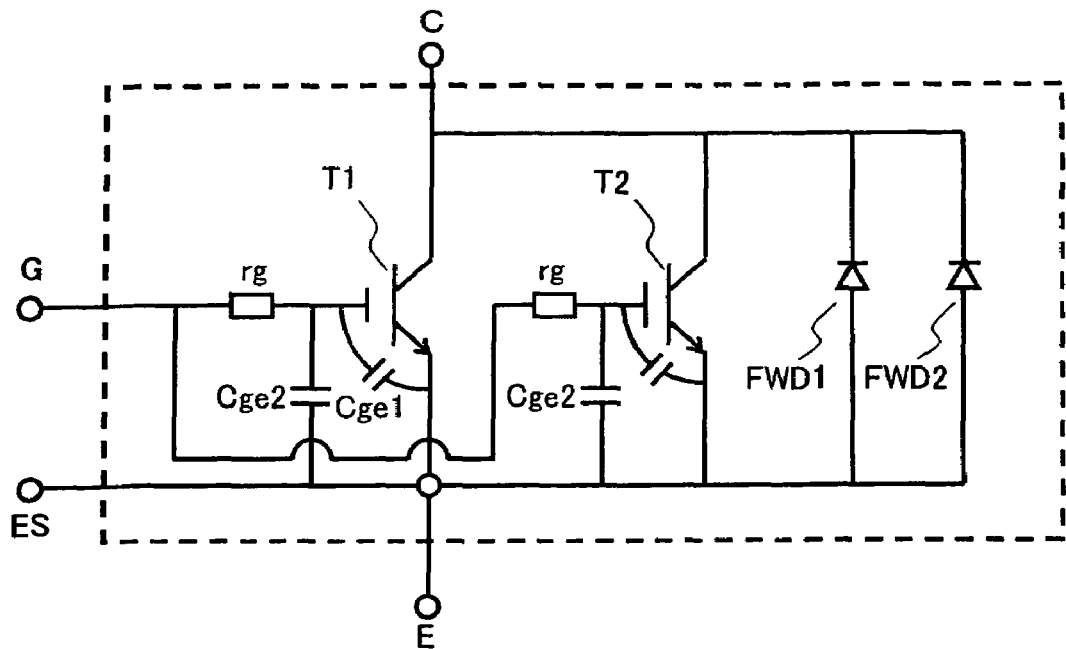
FIG. 17 is a schematic diagram showing a part of a circuit of the semiconductor device which has two or more insulated gate semiconductor chips.

FIG. 17 is a schematic diagram showing a part of a circuit of the semiconductor device which has two or more insulated gate semiconductor chips. That is, the semiconductor device of this example has the structure where parallel connections of two insulated gate semiconductor chips T1 and T2, and free wheeling diodes FWD1 and FWD2 are carried out. And the capacitors Cge2 are provided for each of these semiconductor chips T1 and T2. Each of these capacitors Cge2 has structure which was mentioned above with reference to FIG. 1 through FIG. 16C.

It is more desirable to provide the capacitors Cge2 in the portion nearer to the semiconductor elements T1 and T2 than to the gate resistance rg. The reason is that the effect of the capacitor becomes less susceptible to the resistance by providing the capacitors Cge2 near the semiconductor chips T1 and T2 rather than the gate resistances rg, and thereby higher effect of the capacitor can be obtained.

Second Embodiment

Next, the semiconductor device which includes a capacitance regulation circuit which add a given capacitor between the gate and the emitter only in the partial period of the switching will be explained as a second embodiment of the invention.

Figure 18:
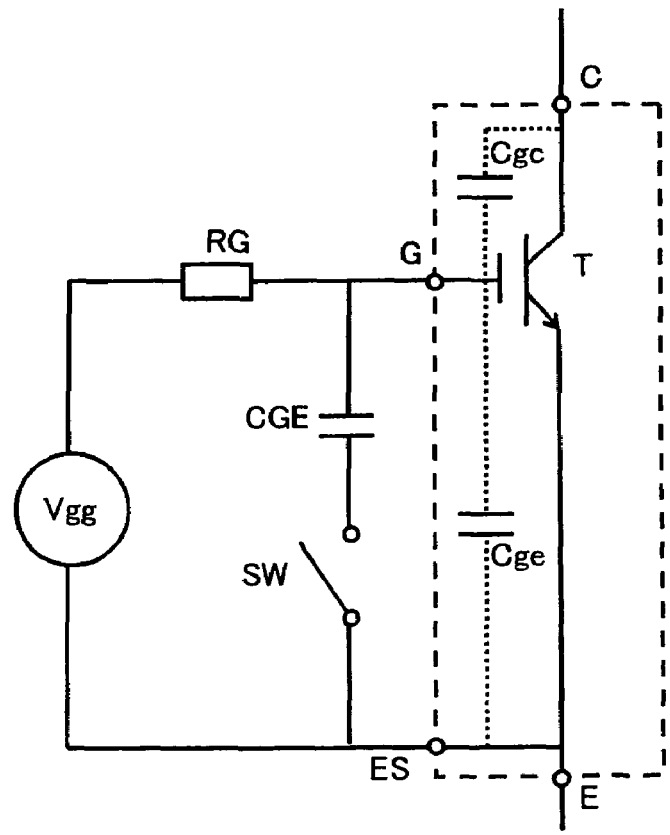
FIG. 18 is a conceptual diagram showing the fundamental structure of the second embodiment of the invention.

FIG. 18 is a conceptual diagram showing the fundamental structure of the embodiment. That is, the insulated gate switching element T has the collector main electrode C, the emitter main electrode E, and the gate electrode G. As the switching element, various kinds of elements which have the insulated gate structure, such as IGBT and Power MOS, for example, can be used.

The parasitic capacitance Cge between the gate and the emitter, and the parasitic capacitance Cgc between the gate and the collectors exist inside of the switching element T. And gate voltage Vgg is applied appropriately between the gate control electrode G and the emitter sense electrode ES, and thus, the switching operation is controlled. Moreover, gate resistance RG is connected between the gate electrode G and the gate drive source Vgg in order to control the speed of switching.

And in this embodiment, the capacitor CGE is provided in parallel between the gate and the emitter as the capacitance regulation circuit, and can be appropriately connected or disconnected by the switch SW. The capacitor CGE is connected between the gate and the emitter only in the partial period of the switching of gate G. Such a capacitance regulation circuit may be established inside of the semiconductor device, or may be provided outside thereof.

As for the capacitor CGE, it is desirable to choose the one which have equivalent or larger capacitance than the parasitic capacitance Cge between the gate and the emitter for the same reason as what was mentioned above about the first embodiment.

Figure 19:
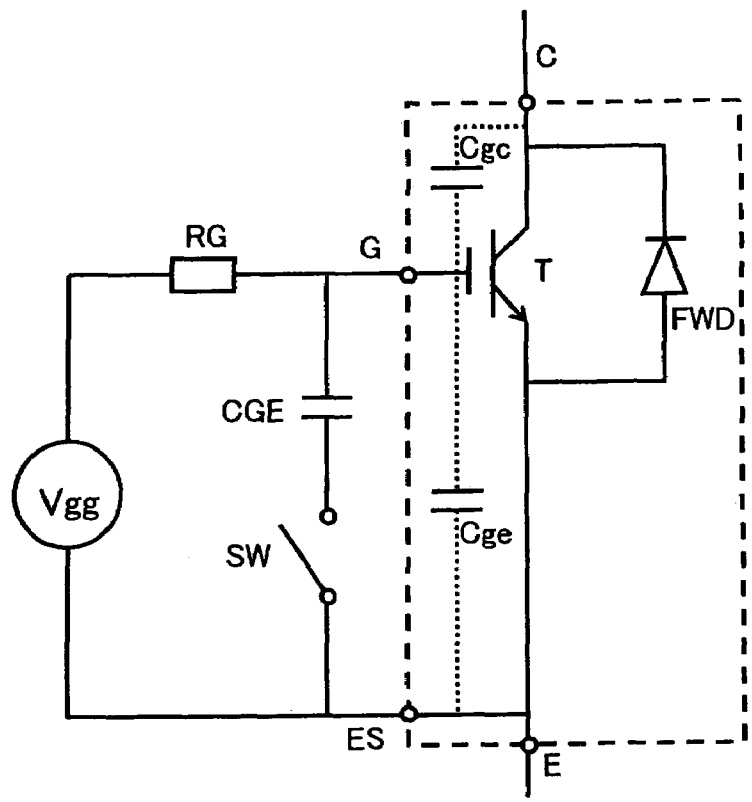
FIG. 19 is a schematic diagram which illustrates the semiconductor device which includes the free wheeling diode.

FIG. 19 is a schematic diagram which illustrates the semiconductor device which includes the free wheeling diode. That is, when applied to power converters, such as an inverter, a free wheeling diode (FWD) is connected to the switching element T in many cases. Parallel connection of the FWD is carried out to the switching element T in the opposite directions of the current flow. The switching element T and the free wheeling diode FWD may be connected as the separate devices.

Figure 20:
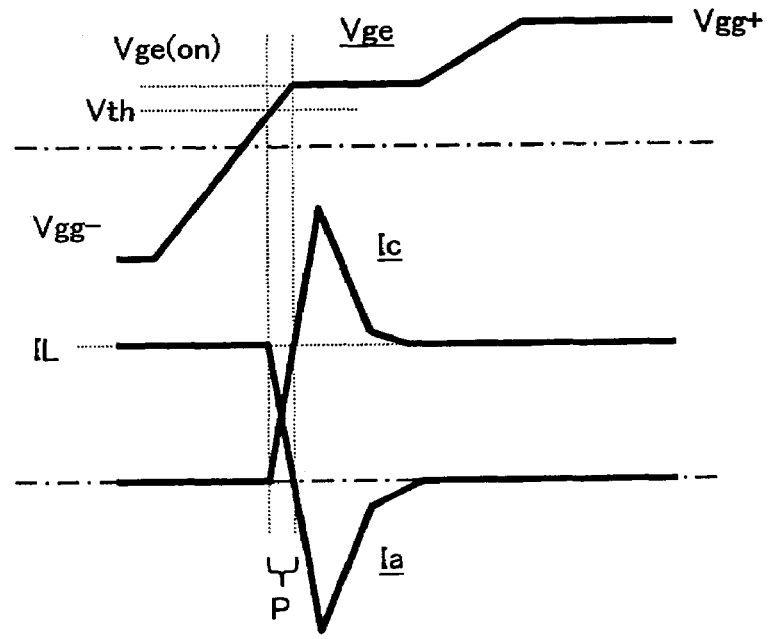
FIG. 20 is a graphical representation which illustrates the waveform of operation at the time of turn-on of the semiconductor device of the second embodiment.

FIG. 20 is a graphical representation which illustrates the turn-on waveform of the semiconductor device of the embodiment. That is, the horizontal axis of the figure expresses time. In FIG. 20, the voltage Vge between the gate and the emitter, the collector current Ic, and the example of a waveform of the anode current Ia of the free wheeling diode FWD (for example, FWD2 for the IGBT1 in FIG. 29) are shown, respectively. Moreover, in this figure, Vgg expresses the gate voltage signal of the switching element T, Vth expresses the threshold value of the voltage between the gate and the emitter, and Vge (on) expresses the voltage required to flow load current IL, respectively.

As shown in this figure, the voltage Vge rises from the Vgg-level to the Vge (on) through the threshold value Vth with the start of turn-on operation. Then, the voltage Vge between rises again, after passing through a Miller period when voltage is constant, and it reaches the Vgg+ level.

And according to the period until the voltage Vge reaches the Vge (on) after it reaches the Vth, dI/dt at the time of Ic rise and dI/dt at the time of Ia fall are determined. That is, dI/dt is determined by CR time constant, i.e., ((Cge+CGE)×RG) and the gate conductance gm of IGBT. And in this embodiment, it is most desirable that the switch SW is closed and the capacitor CGE is connected only during the period P from Vth to Vge (on).

This is because that dI/dt can be reduced and the same effect as the first embodiment is attained by connecting CGE during the period P. In periods other than the period P, i.e., before the period P and after the Miller period, the gate charge time and electric power will not increase by disconnecting CGE to make only the parasitic capacitance Cge remain.

The same explanation as the above explanation can be made with regard to the operation of turn-off.

Figure 21:
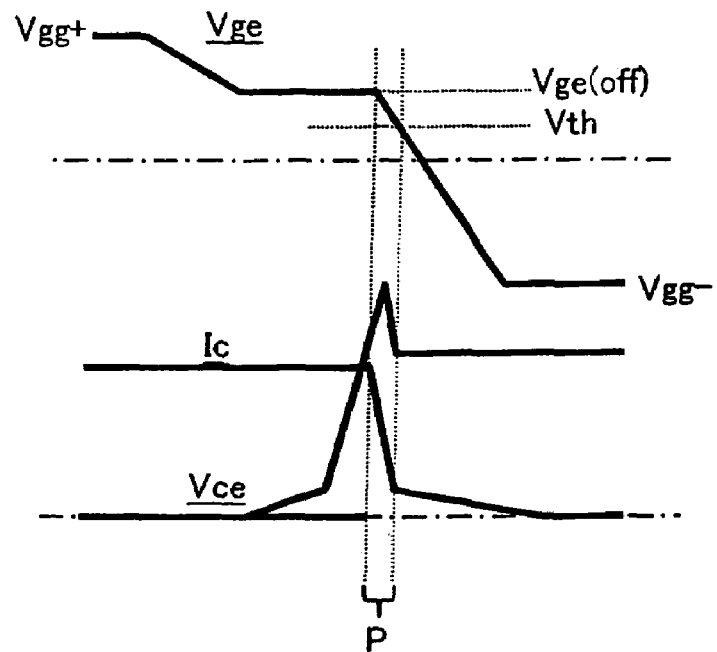
FIG. 21 is a graphical representation which illustrates the waveform of operation at the time of turn-off of the semiconductor device of the second embodiment.

FIG. 21 is a graphical representation which illustrates the turn-off waveform of the semiconductor device of this embodiment. As shown in this figure, also in the case of turn-off, dI/dt can be reduced and the same effect as the first embodiment is attained by connecting CGE during the period P until the voltage Vge between the gate and the emitter falls from the Vge (on) to a threshold value Vth.

Figure 22:
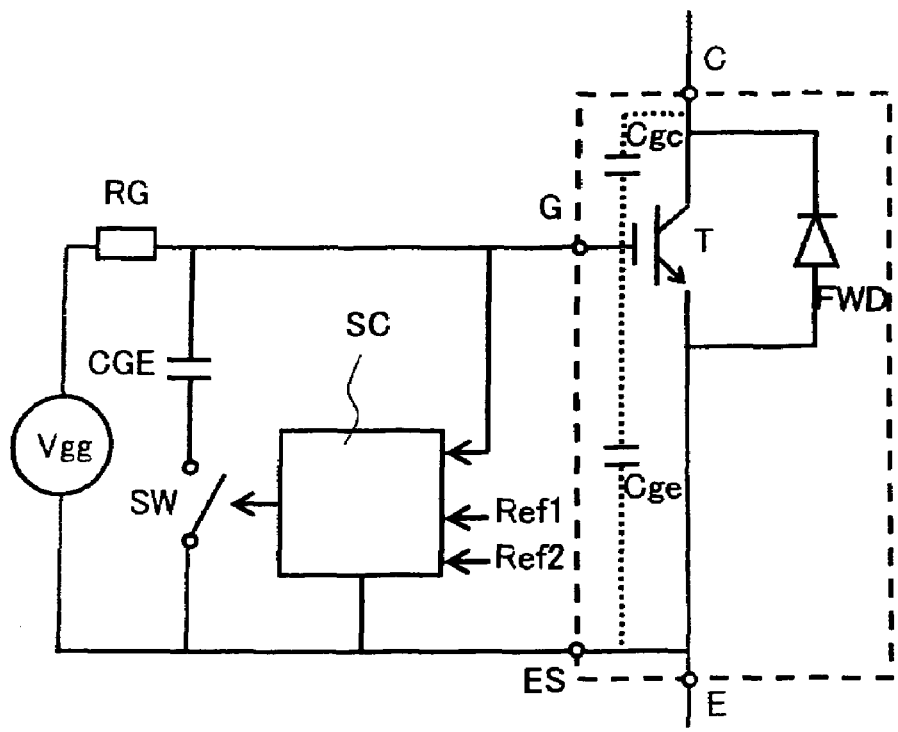
FIG. 22 is a schematic diagram showing the example in which the detection comparator is provided.

FIG. 22 is a schematic diagram showing the example in which the detection comparator is provided. That is, the detection comparator SC which detects and compares the voltage Vge between the gate and the emitter is provided. And capacitor CGE is connected with right timing by setting one or more reference values on this detection comparator SC, comparing that value and Vge, and operating the switch SW.

As the reference values set on the detection comparator SC, 0V (zero bolt), (Vth−α) and (Vge(on)+α) (α>0) are chosen, and the switch SW is closed during only the period (the period P in FIG. 20) which determines dI/dt and the capacitor CGE is connected. Since the time constant of other periods is (Cge×RG), switching time hardly increases.

Moreover, the gate resistance RG can be made smaller than before by making the capacitor CGE have a larger capacitance than the parasitic capacitance Cge, and thus, the switching time can be shortened without increasing dI/dt. Simultaneously, it becomes possible to reduce the switching loss of the whole device by reducing the turn-on loss by shortening the Miller period of the switching element T, and by reducing the reverse recovery loss of the free wheeling diode FWD by making dI/dt smaller.

Figure 23:
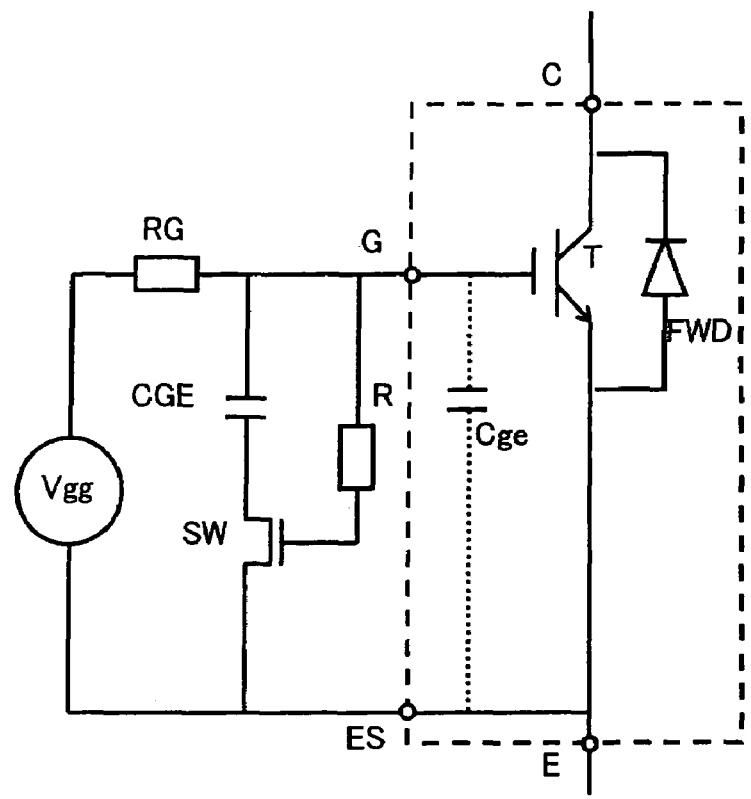
FIG. 23 is a schematic diagram showing the example which controls switch SW by feedback from the gate voltage of the switching element T.

FIG. 23 is a schematic diagram showing the example which controls switch SW by feedback from the gate voltage of the switching element T. That is, MOSFET is used as a switch SW and a control wiring is given to the gate of MOSFET through the regulation resistance R from the gate of the switching element T. It is possible to turn on MOSFET (SW) in the period P expressed in FIG. 20 by making the gate threshold value of MOSFET (SW) equivalent level to the threshold value Vth of the switching element T. Thus, dI/dt can be controlled automatically.

Figure 24:
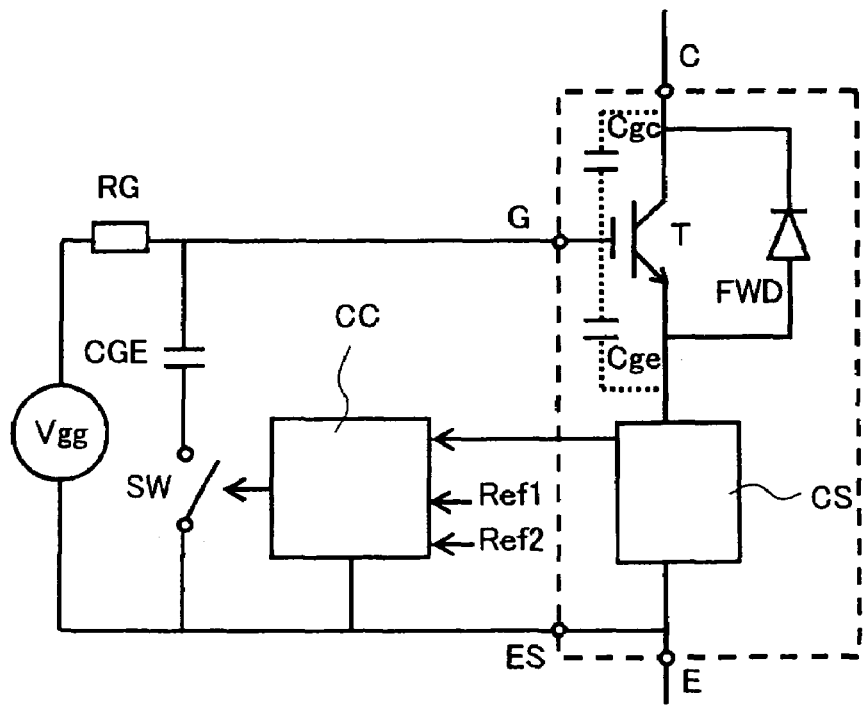
FIG. 24 is a schematic diagram showing the example which controls the switch SW by feedback from a current monitor.

FIG. 24 is a schematic diagram showing the example which controls the switch SW by feedback from a current monitor. That is, the current detector CS detects the current which flows through the switching element T or the free wheeling diode FWD. The detection result is sent to the current comparator CC, and a rate of current change is compared with the given reference value. The signal which controls the switch SW is outputted based on the comparison result. That is, when the predetermined rate of current change is detected like the period P shown in FIG. 20, the switch SW can be closed and the capacitor CGE can be connected at the right timing. The current detector of non-contact type, such as a Rogowski coil and a Hall device, can be used for the current detector.

Figure 25:
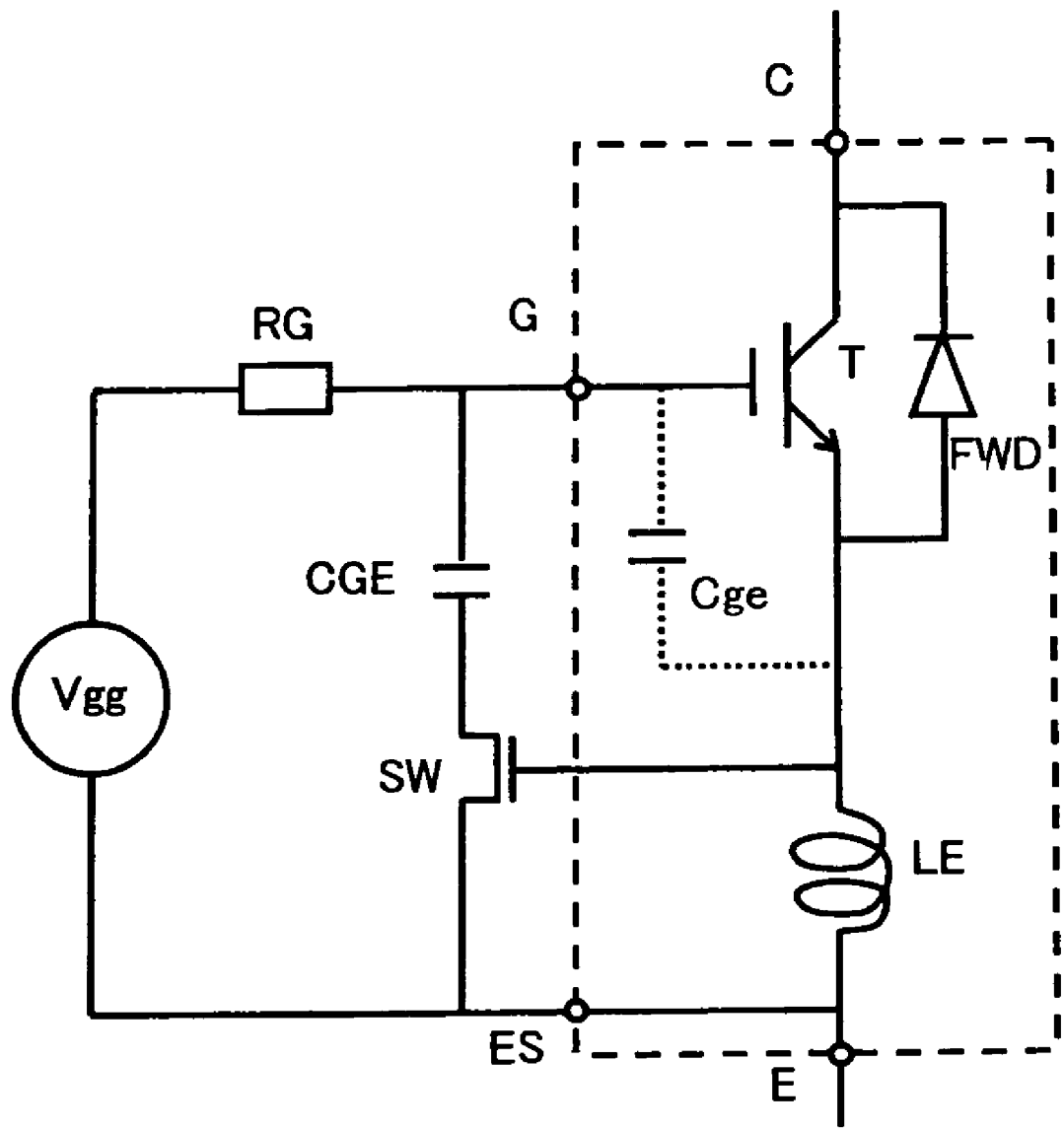
FIG. 25 is a schematic diagram which shows the example which obtains feedback by an inductor not using the current detector of the non-contact type.

FIG. 25 is a schematic diagram which shows the example which obtains feedback by an inductor not using the current detector of the non-contact type. That is, inductor LE is provided as a detector of rate-of-change of current dI/dt which flows the switching element T. Since the induced electromotive force proportional to arises in such an inductor LE, it is possible to turn on MOSFET used as the switch SW and to connect the capacitor CGE only when positive predetermined dI/dt occurs. Moreover, in the case of this example, also in the state when dI/dt is less than a predetermined level, i.e., the state where the switch SW does not turn on, dI/dt can be suppressed by inserting the inductor LE.

Figure 26A:
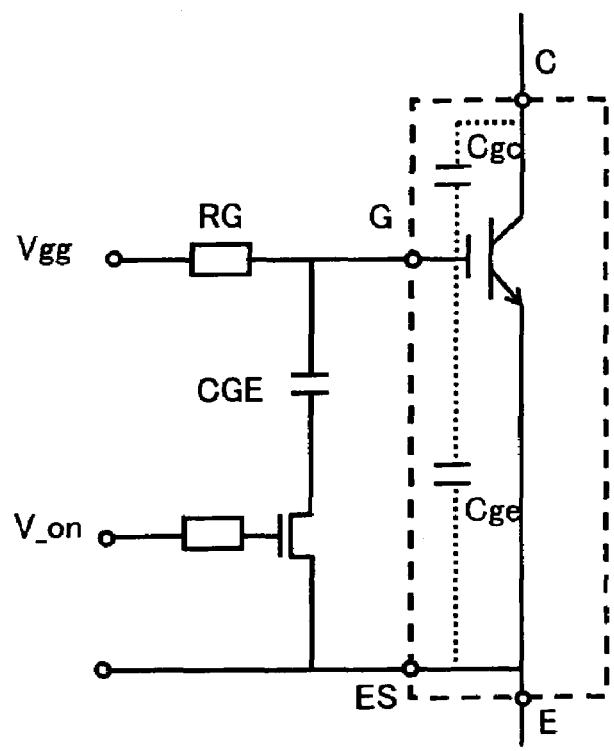
FIG. 26A is a schematic diagram showing the example where the switch SW is controlled by another control signal Von.

FIG. 26A is a schematic diagram showing the example where the switch SW is controlled by another control signal. That is, in the case of the examples illustrated in FIG. 22 through FIG. 25, the control signal of the switch SW is made based on the gate drive signal Vgg of the switching element T.

Figure 26B:
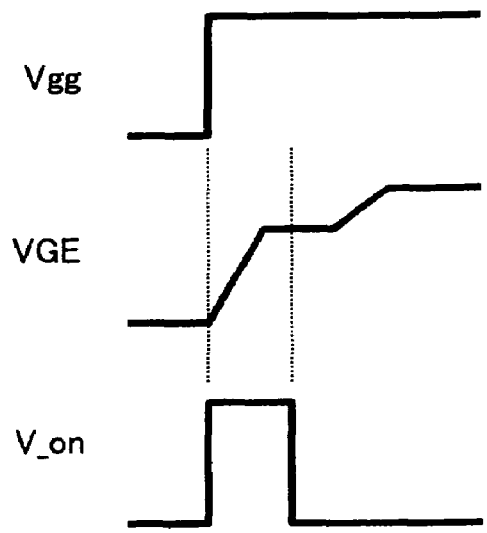
FIG. 26B shows the timing of operation of the switch SW.

On the other hand, in the case of this example, the control signal Von is supplied to the switch SW from the control circuit (not shown) provided independently from the gate drive signal Vgg. The timing of operation of this switch SW is shown in FIG. 26B. That is, the gate drive signal Vgg over the switching element T becomes high-level, and the control signal Von of the switch SW is made high-level until Vge reaches the Vge (on) level (refer to FIG. 20).

In the case of the example illustrated in FIG. 26A, the same effect as what was mentioned above with reference to FIG. 22 through FIG. 25 is attained by supplying the control signal Von at such timing, and operating the switch SW.

Figure 27:
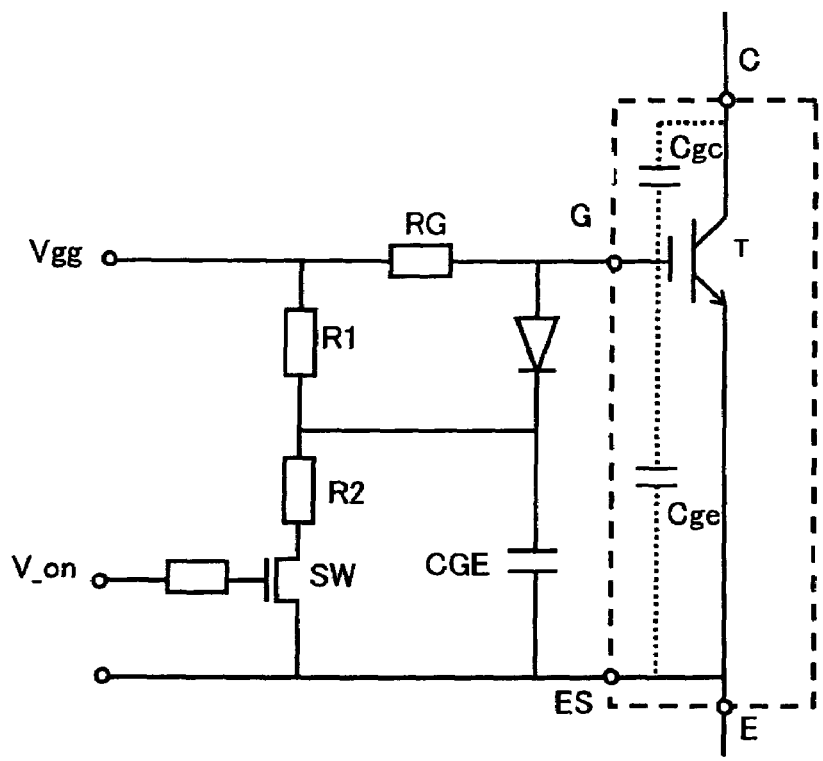
FIG. 27 is a schematic diagram showing the example where the switch SW is controlled by a control signal Von.

FIG. 27 is a schematic diagram showing the example where the switch SW is controlled by a control signal Von.

In this example, the gate drive signal Vgg is divided by resistances R1 and R2 and applied to the capacitor CGE by turning on the switch SW. On the other hand, a control signal Von is given to the switch SW through the resistance R3. It is desirable to make CR constant with the parasitic capacitance Cge be in the following ranges:

$$R1 \times CGE < Cge \times RG \quad (4)$$

Furthermore, it is desirable that the relation between the resistances R1 and R2 satisfies the following condition:

$$R2/(R1+R2) \cong Vth \quad (5)$$

Here, Vth is the threshold value voltage of the switching element T.

In this example, resistances R1 and R2 are selected so that the conditions (4) and (5) may be satisfied. Although the capacitor CGE is charged more quickly than Cge, charge is once interrupted when the voltage between its both ends is about Vth by the dividing resistances R1 and R2. During the period, the diode is reverse-biased and it does not pass the current. If the voltage at both ends of the parasitic capacitance Cge exceeds the voltage of the capacitor CGE, the parasitic capacitance Cge and the capacitor CGE will be slowly charged through the gate resistance RG and the diode. Then, dI/dt of the switching element T is controlled. That is, it is possible to turn on the switch SW and to connect the capacitor CGE with the right timing and period like the period P expressed in FIG. 20.

If MOSFET (SW) is turned off after VGE reaches Vge (on), CGE will be again charged promptly through resistance R1, and the parasitic capacitance Cge will be charged through the gate resistance RG as well as the conventional devices.

Unlike the above-explained embodiments, in this circuit, CGE is not connected in-series with SW, but connected between the gate and the emitter E (ES) in series to the diode whose anode is the gate of the switching element T. Therefore, it becomes possible to suppress the rise of the gate voltage of the element T caused by the displacement current of Ccg even if the switch SW is in an OFF state.

Figure 28:
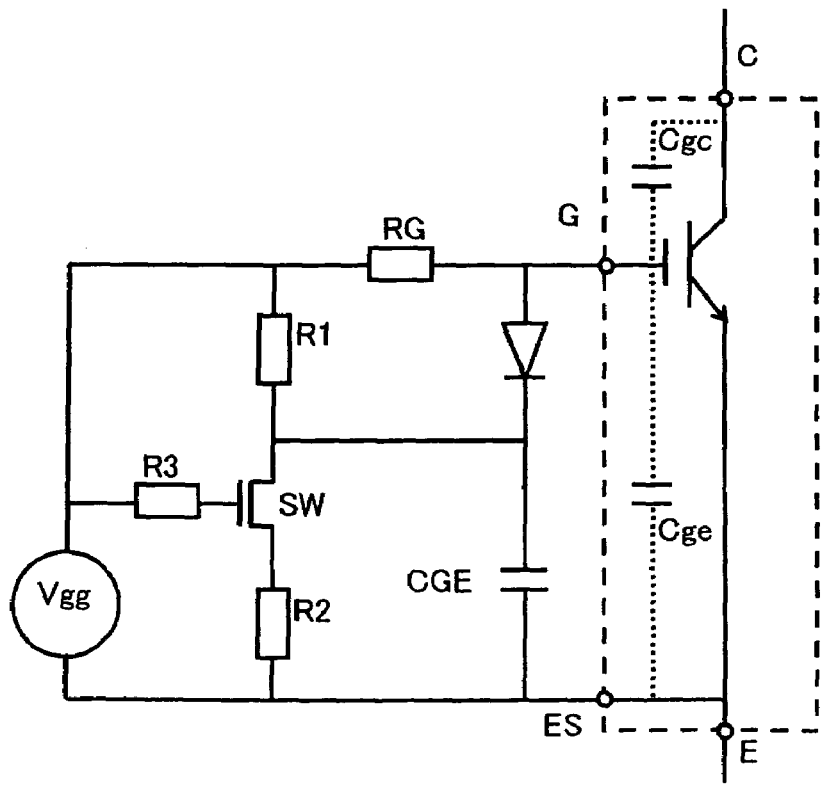
FIG. 28 is a schematic diagram showing the example in which the switch SW is controlled by the gate control signal Vgg.

FIG. 28 is a schematic diagram showing the example in which the switch SW is controlled by the gate control signal Vgg. That is, in this example, the gate drive signal Vgg is divided by the resistances R1 and R2 and applied to CGE by turning on the switch SW like what was shown in FIG. 27. However, in this example, the control signal to the switch SW is given from Vgg. It is also possible to turn on the switch SW and to connect the capacitor CGE with the right timing and right period like the period P expressed in FIG. 20.

Heretofore, the embodiments of the present invention have been explained, referring to the examples. However, the present invention is not limited to these specific examples.

For example, the switching element provided in the semiconductor device of the invention is not limited to IGBT, but can attain the same effect by using IEGT and various kinds of gate insulated type elements including power metal-oxide semiconductor field effect transistors.

Moreover, the capacitance regulation circuit mentioned above with reference to FIG. 18 through FIG. 28 may be provided as a part of the semiconductor device, or may be provided as a part of drive circuit which is provided separately from the semiconductor device.

Moreover, it is not limited to the illustrated examples about the electric elements except the switching element and these arrangement relations, but the swing circuit using an insulated gate semiconductor element and its drive circuit which may be appropriately selected by those skilled in the art with the known techniques to carry out the invention as taught in the specification may also be included within the scope of the invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A capacitance regulation circuit that regulates a capacitance which is added to a semiconductor element having a first main electrode, a second main electrode and a control electrode, a current flowing between the first and second main electrodes being controlled by a control signal which is input between the control electrode and the second main electrode, comprising:
   a capacitor; and
   a switch,
      wherein the switch operates so that the capacitor is connected between the second main electrode and the control electrode during a part of a period when a voltage between the second main electrode and the control electrode changes in accordance with a switching operation of the semiconductor element, and
      the capacitor is connected between the second main electrode and the control electrode in response to detection of a change in voltage between the second main electrode and the control electrode such that the capacitor is connected between the second main electrode and the control electrode only when the voltage between the second main electrode and the control electrode substantially changes.

2. The capacitance regulation circuit according to claim 1, wherein the part of the period is a part of a period when a current flowing between the first and the second main electrodes increases on an occasion of a turn-on of the semiconductor element.

3. The capacitance regulation circuit according to claim 1, wherein the part of the period is a part of a period when a current flowing between the first and the second main electrodes decreases on an occasion of a turn-off of the semiconductor element.

4. The capacitance regulation circuit according to claim 1, wherein the switch has a first main electrode, a second main electrode, and a control electrode, a current flowing between the first and second main electrodes being controlled by a control signal which is input between the control electrode and the second main electrode, and
   the control electrode of the switch is connected to the control electrode of the semiconductor element via a voltage regulator.

5. A semiconductor device comprising:
   a semiconductor element having a first main electrode, a second main electrode and a control electrode, a current flowing between the first and second main electrodes being controlled by a control signal which is input between the control electrode and the second main electrode; and
   a capacitance regulation circuit that regulates a capacitance which is added to the semiconductor element, the capacitance regulation circuit including a capacitor and a switch,
      wherein the switch operates so that the capacitor is connected between the second main electrode and the control electrode during a part of a period when a voltage between the second main electrode and the control electrode changes in accordance with a switching operation of the semiconductor element, and
      the capacitor is connected between the second main electrode and the control electrode in response to detection of a change in a voltage between the second main electrode and the control electrode such that the capacitor is connected between the second main electrode and the control electrode only when the voltage between the second main electrode and the control electrode substantially changes.

6. The capacitance regulation circuit according to claim 1, further comprising a resistive element connected to the control electrode, and the capacitor is connected between the control electrode and the resistive element.

7. The semiconductor device according to claim 5, further comprising a resistive element connected to the control electrode, and the capacitor is connected between the control electrode and the resistive element.

8. The capacitance regulation circuit according to claim 1, wherein a sum of a capacitance of the capacitor and a parasitic capacitance formed between the second main electrode and the control electrode in the semiconductor element divided by an amperage rating of the semiconductor element is larger than 0.3 nF/A.

9. The semiconductor device according to claim 5, wherein a sum of a capacitance of the capacitor and a parasitic capacitance formed between the second main electrode and the control electrode in the semiconductor element divided by an amperage rating of the semiconductor element is larger than 0.3 nF/A.

* * * * *